United States Patent
Uchiyama et al.

(10) Patent No.: US 6,534,751 B2
(45) Date of Patent: Mar. 18, 2003

(54) WAFER HEATING APPARATUS AND CERAMIC HEATER, AND METHOD FOR PRODUCING THE SAME

(75) Inventors: Kyoji Uchiyama, Yokaichi (JP); Kouji Sakamoto, Kokubu (JP); Hidenori Nakama, Kokubu (JP); Satoshi Tanaka, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/797,497

(22) Filed: Feb. 28, 2001

(65) Prior Publication Data
US 2002/0158060 A1 Oct. 31, 2002

(30) Foreign Application Priority Data

Feb. 28, 2000 (JP) ........................ 2000-050976
Jun. 26, 2000 (JP) ........................ 2000-191609

(51) Int. Cl.[7] ..................... H05B 3/68; C23C 16/00
(52) U.S. Cl. ..................... 219/444.1; 118/725
(58) Field of Search ................... 219/444.1, 465.1, 219/466.1, 467.1, 543, 544, 546, 547, 548; 118/724, 725, 728

(56) References Cited
U.S. PATENT DOCUMENTS

| | | | | |
|---|---|---|---|---|
| 3,895,216 A | * | 7/1975 | Hurko | 219/435 |
| 3,978,316 A | * | 8/1976 | Rose et al. | 219/543 |
| 4,458,746 A | * | 7/1984 | Holden et al. | 118/503 |
| 4,956,043 A | * | 9/1990 | Kanetomo et al. | 156/345.27 |
| 4,973,826 A | * | 11/1990 | Baudry et al. | 219/466.1 |
| 5,306,895 A | * | 4/1994 | Ushikoshi et al. | 118/725 |
| 5,854,468 A | * | 12/1998 | Muka | 204/298.25 |
| 6,072,162 A | * | 6/2000 | Ito et al. | 118/715 |

\* cited by examiner

Primary Examiner—Sang Paik
(74) Attorney, Agent, or Firm—Hogan & Hartson, LLP

(57) ABSTRACT

A wafer heating apparatus is provided, including a heat-homogenizing plate comprising a ceramic substrate and having a mounting surface which is an upper surface of the ceramic substrate for mounting a wafer thereon, a heating element provided on the lower surface of the heat-homogenizing plate and pad electrodes connecting electrically to the heating element on said lower surface, wherein the mounting major surface is convex, particularly, with the height of the central portion of the mounting major surface with respect to the periphery thereof is in a range of 10 to 80 $\mu$m. In the wafer heating apparatus a plurality of supporting pins are planted on the mounting surface to support the wafer thereon placed from the mounting surface. The ceramic substrate includes silicon carbide, and an insulating layer is secured on the ceramic substrate and the heating element is secured on said insulating layer, the insulating layer being a glass layer having an lower expansion coefficient by $0.2 \times 10^{-6}$/K to $0.7 \times 10^{-6}$/K than the ceramic substrate.

15 Claims, 10 Drawing Sheets

WAFER HEATING APPARATUS AND CERAMIC HEATER, AND METHOD FOR PRODUCING THE SAME

BACKGROUND OF THE INVENTION

1. Field of the Invention

The present invention relates to a wafer heating apparatus to be employed for heating a semiconductor wafer homogeneously, and especially relates to a ceramic heater to be employed for a wafer heating apparatus.

The present invention relates to a method for the wafer heating apparatus and the ceramic heater for heating a wafer homogeneously.

2. Description of the Prior Art

A wafer heating apparatus has been used for, for example, heating a semiconductor wafer, forming a semiconductor thin film on a wafer to be used for a liquid crystal substrate or a circuit substrate, and forming a resist film on a wafer by drying and baking a resist liquid applied to the wafer.

The wafer heating apparatus has been used for, for example, heating a semiconductor wafer (hereafter simply referred as to a wafer) at the time of film formation treatment of a semiconductor thin film, etching and baking treatments for a resist film in the semiconductor device fabrication process.

A batch type apparatus for collectively carrying out film formation treatment for a plurality of wafers has conventionally been employed for semiconductor device fabrication apparatus. Recently, as wafers have been enlarged, e.g. into 8 to 12 inches in diameter, a technique, referred to as one-by-one treatment, has been employed in order to heighten the treatment precision. However, by the one-by-one treatment, the number of wafers to be treated for one time is decreased, so that the time taken to treat the wafers is required to be shortened. Consequently, it is required for a wafer supporting member to shorten the heating duration of a wafer, quickly perform attachment of the wafer thereto and detachment therefrom, and therefore improve the heating temperature precision as well.

As shown in FIG. 14, there has been employed a conventional wafer heating apparatus 31 including a heating plate 32 which is a metal plate made of aluminum or stainless steel and its upper face being used as a mounting surface 33 to mount a wafer thereon, a plurality of sheathed heaters 25 attached as heating element, to the lower face of the heating plate 32, and a presser plate 24 for fixing the heaters 25. Such a heating apparatus 31 is integrated with a container 27 containing the sheathed heaters 25 and lead wires 26 are connected to the sheathed heaters 25.

Such a heating apparatus 31 has been employed for drying a liquid resist coated on a semiconductor wafer W by mounting on the mounting surface 33 and heating the semiconductor wafer W by the heaters 25.

The heating plate 32 made of a metal has been formed rather thick to minimize deformation which would be made in repeatedly heating and cooling processes, and therefore the heating plate 32 has disadvantageously had high thermal capacity, and required considerably long time periods to heat and cool the heating plate effectively, resulting in low productivity.

There has been employed, as another wafer heating apparatus, as shown in FIG. 15, a ceramic heater 31 comprising a ceramic heating plate 32 in the form of a disk, which is made of alumina, silicon nitride, or aluminum nitride, and a heating element 35 buried within the heating plate 32. In this example, the heating apparatus 31 utilizes the upper face of the heating plate 32 as a mounting surface 33 and further includes terminals 36, for power supply, in the lower face, which terminals 36 are connected to the heating element 35 buried within the ceramic body. Although such a type heating apparatus has an advantage to be make a heating plate 32 thinner, it has been impossible to trim the heating resister for adjusting uniform desired resistance distribution because of the buried heating element. Consequently, this type of apparatuses have been not suitable to homogenize temperature distribution over the overall mounting surface 33.

Further, as another heating apparatus 31 for drying a resist film on a semiconductor wafer, an apparatus 31 is disclosed, for example, in Japanese Patent Publication No. 11-2837729 in which this conventional wafer heating apparatus, as illustrated in FIG. 11, is composed of a supporting body 41 on a shallow container, a heating plate 32 of a nitride or carbide ceramic provided on the supporting body 41, and a plate-like reflector 43 interposed immediate under the heating plate 32 over the bottom 41a of the supporting body 41.

In FIG. 12, power supply terminals 37 are joined by soldering to terminal parts of heating element 35 for even heating and the power supply terminals 37 are inserted into the through holes 67 formed in the plate-like reflector 43. Some holes 46 for leading out lead wires are formed in the outer circumference of the bottom part 41a. Lead wires 26 are inserted into the holes 46 to supply an electric current to the heating element and connected to the power supply terminals 37.

The heating apparatus of FIG. 12 is for drying a silicon wafer coated with a photosensitive resin at a high temperature (500° C. or higher) using the heating element in the heating plate 32 supported by dummy pins 47 in an opening 46 of the supporting body 41.

The heating plate 32 with the heating element therein is designed to in the circular form and have approximately same diameter as that of the opening part 44 of the supporting body 41. As illustrated in FIG. 12, the heating plate 32 is of multilayer structure, in which the heating element 35 are buried in between the respective ceramic layers. That is, the heating element 35 of this apparatus are not at all exposed to the outer surface of the heating plate 32. The power supply terminals 37 relevant to electric power input to the heating element 35 are jointed to the heating element 35 by soldering.

The supporting body 41 is a aluminum made member having a bottom and has the opening part 44 with a circular cross-sectional on the upper side. Three holes 45 for inserting wafer-supporting pins therein are formed in the center area of the supporting body 41. By raising and lowering the upper ends of the wafer-supporting pins while supporting a wafer W thereon, the wafer W can easily be transformed to and received from a transporting apparatus, respectively.

Japanese Patent Publication No. 11-40330 discloses a heater for drying a photosensitive resin formed on the wafer surface. The structure of the heater, as referred to FIG. 13, includes a heating plate 32 made of a ceramic and a heating element 35 formed on the lower surface of the heating plate 32, wherein a metal sintered body 34 produced by sintering particles of one or more metal particles selected from gold (Au), silver (Ag), platinum (Pt), palladium (Pd), lead (Pb), tungsten (W), and nickel (Ni) is formed on the ceramic surface, and another metal coated layer 34 is provided on the metal sintered body 33, the metal coated layer 34 being composed of one or more metals selected from Au, Ag, Pd, Pt, and Ni.

In the above case, power supply terminals 37 are fixed in the heating element 35 by soldering. A wafer W can be set spaced from the heating plate 32 by lift pins 39.

An aluminum nitride-based ceramic and silicon carbide-based ceramic, having high thermal conductivity, are both suitable for the heating plate 32 of a semiconductor wafer heating apparatus required for carrying out homogeneously heating the wafer. Nevertheless, silicon carbide-based ceramics can more preferably be used for the heating plate 32 to be employed for the process of drying photosensitive resin films formed on wafers. That is because the aluminum nitride-based ceramic reacts to moisture in air at high temperature to generate ammonia gas which adversely affects the photosensitive resin. As a result, silicon carbide ceramics are more useful for heating plates 32 to be employed for process of drying of the photosensitive resin.

Although Silicon carbide is suitable for ceramic material composing a heating plate 32 from the point of view of high thermal conductivity, this material has semiconductive property to cause patterned resistors of the heating element to conduct electricity, and also electrodes connecting these resistors to conduct electrically, via the ceramic material, particularly, in the case of forming the heating element in the inside and on the surface of the ceramic.

Deformation, especially warp, or bent, of heating plates 32 has often been caused after sintering. Especially, at each time the gap between the heating plate 32 and a wafer W is changed over the area of the surface, the temperature distribution set on the surface of the heating plate 32 must be reset or the heating of positions of the wafer surface near any widened gap between the wafer and the mounting deformed surface of the heater would be delayed during the temperature increasing after a new wafer is substituted, resulting in a non-uniform temperature gradient on the wafer surface.

Further, as for a substrate of the heating plate of silicon carbide-based ceramic, it has been difficult to form a stable insulating layer between the silicon carbide ceramic and the heating element.

At the time of forming heating element, there occurs problems that the dispersion of the thickness of the heating element printed on an insulating layer is widened if the flatness of the insulating film is inferior and the temperature distribution therefore becomes uneven in the heating plate to result in unstableness of the temperature of a wafer.

SUMMARY OF THE INVENTION

An object of the present invention is to provide a wafer heating apparatus including a heat-homogenizing plate which can heat a semiconductive wafer quickly with a homogeneous temperature over the surface of the wafer and a ceramic heater for using such a wafer heating apparatus.

Another object of the invention is to provided a heat-homogenizing plate capable of preventing deformation during quick heating, to heat a wafer with even surface temperature distribution of the wafer.

Another object of the invention is to provide a heat-homogenizing plate having a high thermal conductivity and being effectively capable of electrically insulating a heating element provided on the underside of the heat-homogenizing plate.

Another object of the present invention is to provide a method for the wafer heating apparatus and the ceramic heater for heating a wafer quickly and homogeneously.

A wafer heating apparatus of the invention comprises a heat-homogenizing plate made of a ceramic substrate and having one major surface for employing as a mounting surface for a wafer, a heating element which is provided to the heat-homogenizing plate, and pad electrodes fixed on the heating element to be electrically connected to the heating element, wherein the mounting surface of the heat-homogenizing plate is made slightly convex to provide a proper gap between the mounting face and the underside of the wafer to be evenly heated. Consequently, the evenly heating property of the heat-homogenizing plate to heat a wafer is improved, to homogenize the temperature distribution over the allover area of the wafer. The heating element preferably may be applied on said other major surface of the heat-homogenizing plate to facilitate the adjusting of the resistance distribution of patterned thin resistors making up the heating element.

The present invention further includes a wafer heating apparatus comprising a heat-homogenizing plate made of a ceramic substrate sintered of silicon carbide or boron carbide and having one major surface for employing as a mounting surface for a wafer, an insulating layer formed on said other major surface of the ceramic substrate, and a heating element formed on the insulating layer. The insulating layer can insulate the heating element from the semiconductive ceramic substrate. Such an insulating layer preferably may comprise an insulating glass or a heat-resistant insulating resin.

The wafer heating apparatus of this structure permits the heat-homogenizing plate to be sufficiently thin that the apparatus exhibits rapidly rising and enhanced homogenizing temperature property of the heat-homogenizing plate for heating a wafer. Especially, the heat-homogenizing plate may have a thickness of 2 to 7 mm, to assure rapidly rise of wafer temperature by the heating of the heating element, then simultaneously achieving uniform temperature distribution over the overall area of the wafer.

Furthermore, the present invention includes a ceramic heater for making up a wafer heating apparatus, which comprises a heating element on an insulating layer formed by forming a silicon oxide ($SiO_2$) film having 0.05 to 2.0 $\mu$m of thickness on said other major surface of a substrate made of silicon carbide ceramic and forming a glass insulating layer of 10 to 600 $\mu$m thickness on the silicon oxide film as well as pad electrodes electrically connected to the heating element.

By controlling the flatness of the insulating layer to be 300 $\mu$m or lower, the thickness of the heating element formed by a printing method can be controlled within a prescribed range and consequently, the precision of the temperature control of a wafer can be improved.

DETAILED DESCRIPTION AND EMBODIMENTS OF THE INVENTION

A wafer heating apparatus of the present invention generally comprises a heat-homogenizing plate made of a ceramic substrate and a heating element attached to one face of the heat-homogenizing plate and is provided with electricity communication pad electrodes to be connected to the heating element to be a ceramic heater. The ceramic heater is supported by a proper supporting body and the lower face of the heat-homogenizing plate, which is in the reverse side of the face where the heating element are formed, is utilized as a mounting surface to compose a wafer heating apparatus. At the time of use, a wafer to be subjected to heating is mounted directly on or supported indirectly by the mounting surface of the ceramic heater to be heated.

The heat-homogenizing plate is like a plate having a proper thickness and is made larger than a wafer. The heat-homogenizing plate is a stable and heat resistant substrate and the ceramic to be used for the heat-homogenizing plate may be ceramics mainly containing silicon carbide, silicon nitride, aluminum nitride, boron nitride, boron carbide, or alumina.

Figure 1:
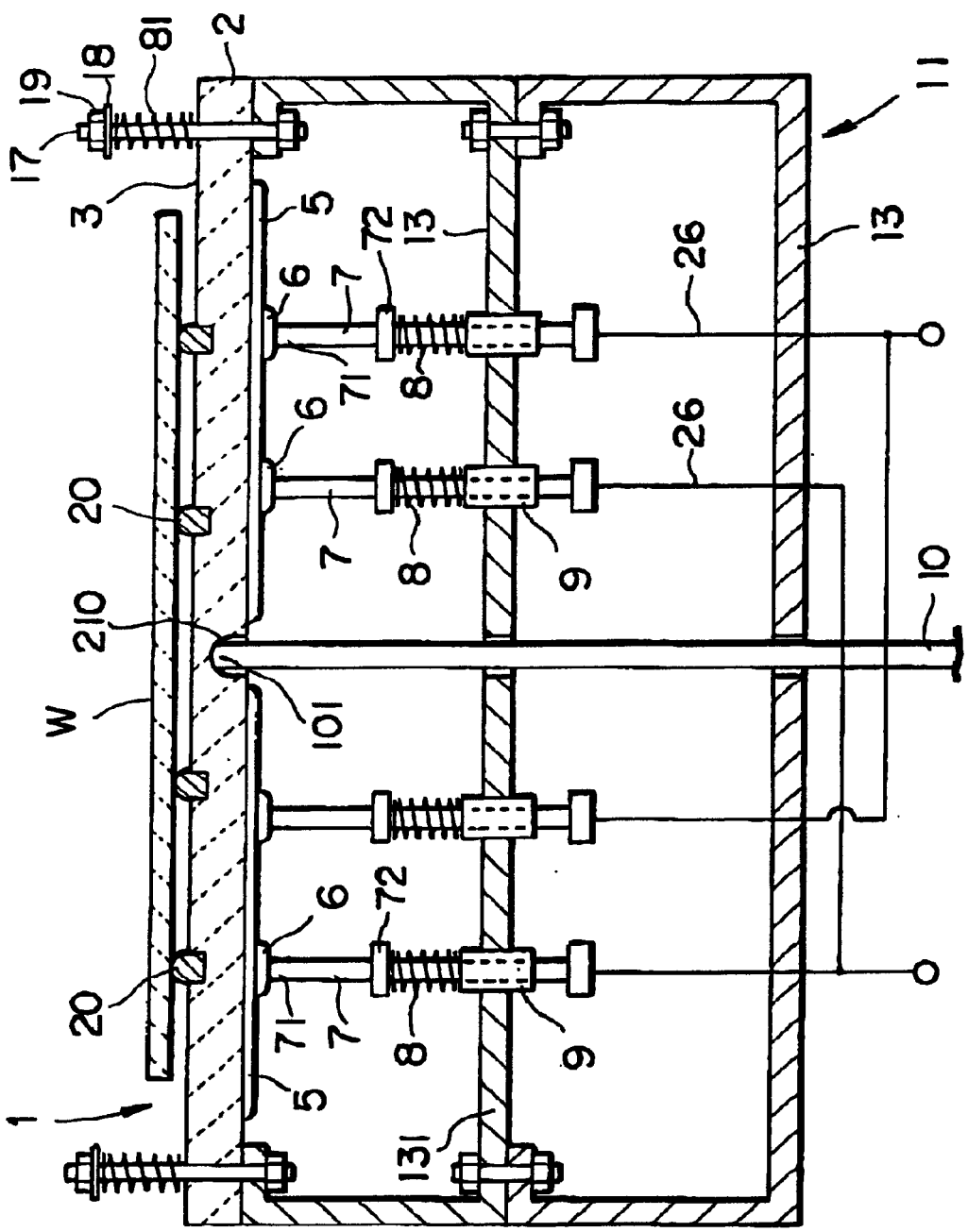
FIG. 1 shows a cross-sectional view of a wafer heating apparatus relevant to an embodiment of the present invention.

FIG. 1 shows a wafer heating apparatus 1 relevant to an embodiment of the present invention and one major surface of the heat-homogenizing plate 2 made of a ceramic plate-like body is set to be a mounting surface 3 to mount a wafer W thereon. In the Figure, a type in which the mounting surface 3 and the water W are parted is shown. The heating element 5 is formed in the other side of the mounting surface side and a plurality of projection members, that is, supporting pins, 20 are formed in the mounting surface side to mount the wafer W thereon and hold the wafer W at a gap from the mounting surface 3. Consequently, a problem can be avoided that the wafer W is evenly brought into contact with the heat-homogenizing plate 2 and the temperature distribution evenness is lowered.

Figure 8:
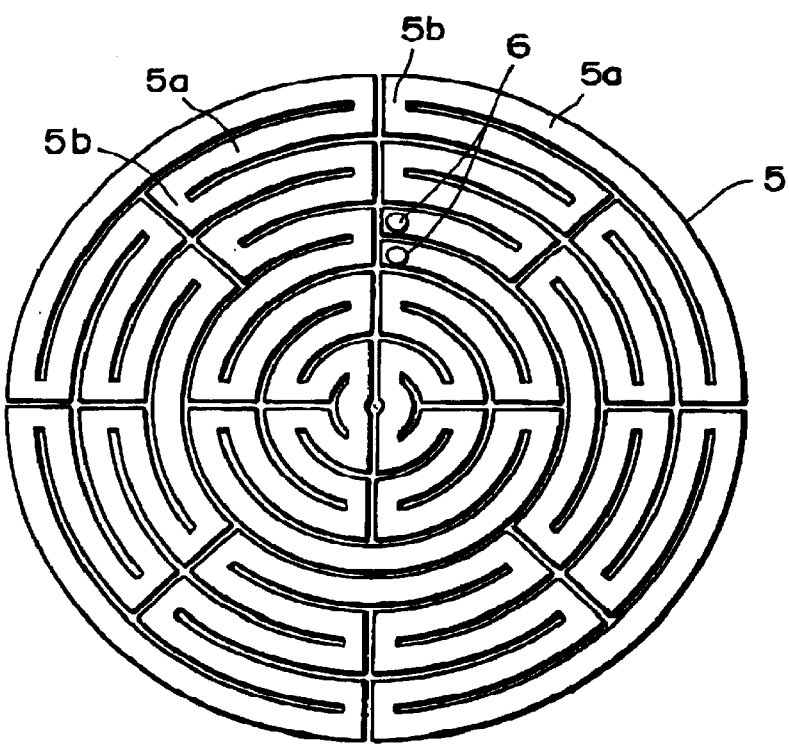
FIG. 8 and FIG. 9 show the patterns of heating element formed on a ceramic substrate within or on a heat-homogenizing plate.
Figure 9:
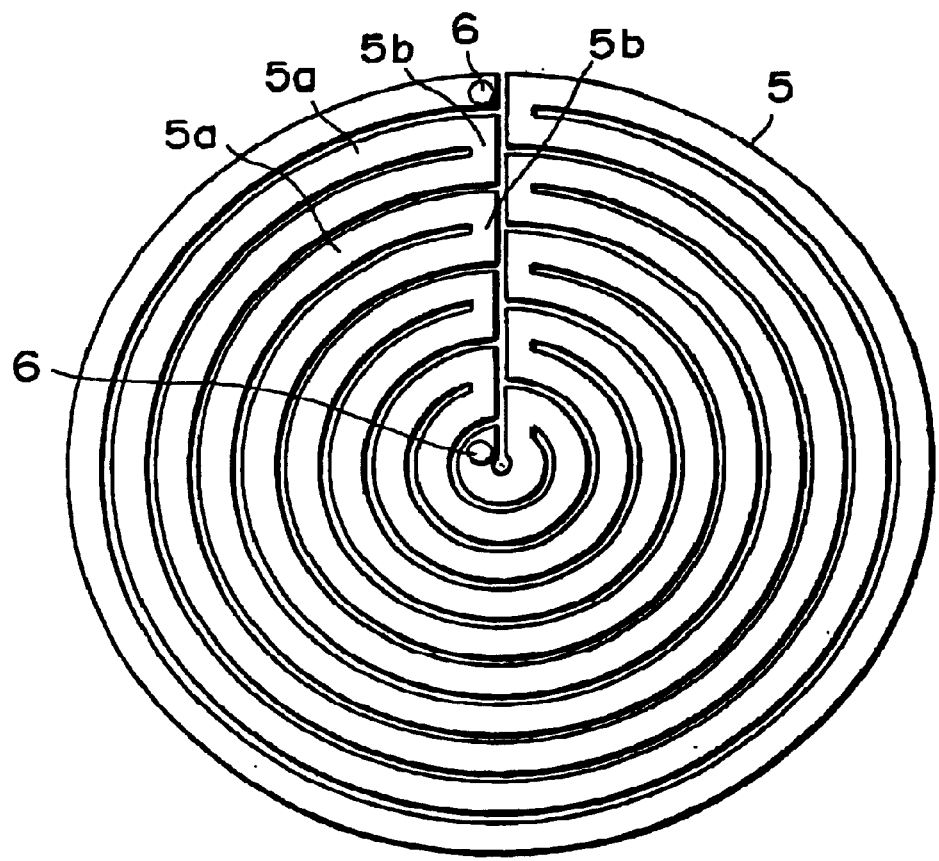

In the lower face of the heat-homogenizing plate 2, the heating element 5 is formed by patterning a metal thin film of, for example, Au, Pt-group metals or their alloys and the heating element 5 is provided with pad electrodes 6 electrically connected therewith. Examples of the patterned heating element 5 are shown in FIG. 8 and FIG. 9 and a pair of pad electrodes 6, 6 for power input are formed in both end parts of the heating element 5, which include an arrangement of curved segments 5a of film resistors and connecting parts 5b between ends of the curved segments 5a. Such a heat-homogenizing plate 2 is joined to the upper face of the supporting body 11 by screws 17 and the pad electrodes 6 are connected with bar—shaped terminals 7 for power supply by forcing the end portion 71 of the terminals 7 to the pad electrodes 6. In addition, the periphery of the heat-homogenizing plate is disposed in contact to the supporting body 11, resulting in quickly heat transfer toward said body 11, and then interfering with uniform heat distribution over the mounting surface 3. Therefore, the heating element 5 beneath the heat-homogenizing plate 2 is designed to create a higher calorific value in the peripheral area than in the central area to obtain uniform temperature distribution on the overall mounting surface.

In the supporting body 11, an intermediate horizontal partitioning plate 13 is installed immediate under the heat-homogenizing plate 2 and the power supply terminals 7 are so supported as to be upward forced from the partitioning plate 13 by elastic members 8 and at the same time as to be insulated from the plate-like structure body (the intermediate horizontal partitioning plate) 13. Lead wires 26 are connected to the power supply terminals 7 to connect the terminals with an outside power source.

Embodiment 1

Figure 2A:
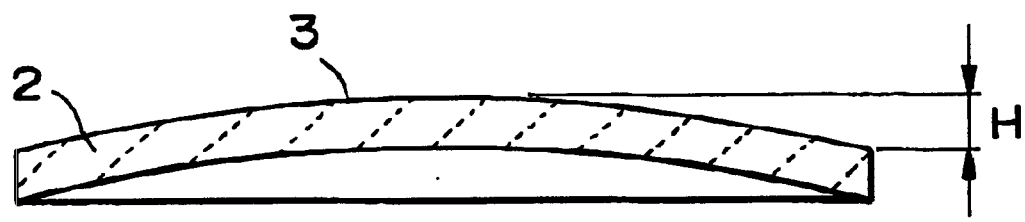
FIG. 2A and FIG. 2B show cross-sectional views of a heat-homogenizing plate to be employed for a wafer heating apparatus of the present invention.
Figure 2B:
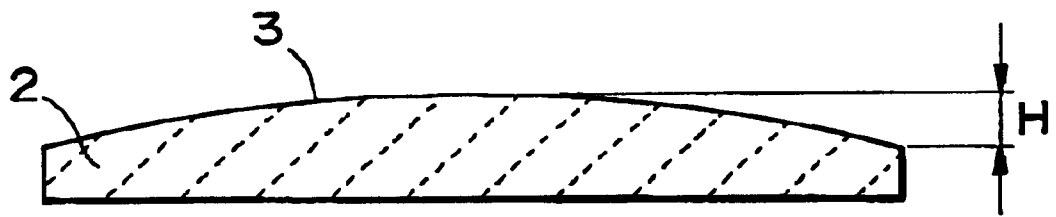

In this embodiment of the present invention, the mounting surface 3 of the heat-homogenizing plate 2 is made to be an upward convex surface shape. With such a heat-homogenizing plate, as shown in FIG. 2A, a ceramic plate made to be a thin plate is enables to have a convex face in the upper side, i.e., a mounting surface 3, and a concave face in the lower side. In another embodiment, as shown in FIG. 2B, the heat-homogenizing plate 2 may be enabled to have the convex face as the mounting surface 3 and a flat face in the lower side.

It is preferred that the height H of the mounting surface 3 of the heat-homogenizing plate 2, i.e., the height of the center part in relation to the periphery from the mounting surface to a edge of the mounting surface be within 10 to 80 $\mu$m. Especially, the height is further preferable to be within the defined range when the horizontal dimension of the heat-homogenizing plate 2 comply with wider wafers of diameter within a range from about 8 to 12 inches or more.

If the projection height of the mounting surface 3 is lower than 10 $\mu$m or the mounting surface 3 is a concave face, the distance of the heat-homogenizing plate 2 to the center part of a wafer W is wider than that to the peripheral part of the wafer W, so that heat transmission from the heat-homogenizing plate 2 to the peripheral part is slow. In general, the part near the center of a wafer is heated more quickly than the peripheral part by all means when the whole body of a heat-homogenizing plate 2 is heated to increase the temperature quickly.

Even though heating can generally be controlled by suppressing the heat radiation quantity in the center part of the wafer W more than that in the peripheral part of the wafer W, however the control of the heating output in the center part at the time of rapid heating becomes very difficult if the distance of the center part to the heat-homogenizing plate 2 is larger than the distance of the peripheral part to the heat-homogenizing plate 2. Especially, it is undesirable that, in the case where the temperature setting is changed for the heat-homogenizing plate 2 or in the case where a wafer W is replaced with another wafer W, the temperature dispersion of the wafer during the transition period of the heating becomes wide, for the effect of the thermal treatment of such as heating of a resist on the face of the wafer W becomes uneven.

On the other hand, if the heat-homogenizing plate 2 is so processed as to provide a convex mounting surface 3, the distance between the heat-homogenizing plate 2 and a wafer W is narrowed, the temperature control can advantageously be carried out especially in the case of rapid heating.

However, if the projection height H exceeds 80 μm, a wafer W is rotated or rattled attributed to conditions of supporting pins formed in the mounting surface 3 of the heat-homogenizing plate 2 to result in requirement of a long time to stabilize the wafer and therefore that is not preferable.

One of important factors affecting the heating rate of a wafer W is the distance between the wafer W and the heat-homogenizing plate 2. Though the distance of the wafer W and the heat-homogenizing plate 2 is preferable to be made narrower since the heating rate is heightened more at the time of replacement wafers W, evenly heating control becomes hard. To the contrary, if the distance between the wafer W and the heat-homogenizing plate 2 is kept wide, heating is carried out evenly but the heating rate becomes slow. To utilize the quick heating capability, the distance between the center part of the wafer W is preferably kept to be 200 μm or narrower. Since the quick heating capability is deteriorated because of the above-mentioned reasons if the projection height H is too high, that is not preferable.

By the following method, the projection height H can be adjusted; a heat-homogenizing plate 2 previously polished to be flat in the major surface is forced against a plate, for example, a resin plate, made to have a concave face recessed to the extent equivalent to the desired projection height, for example, 10 to 80 μm; the major source and the concave face are closely attached to each other; the other major surface is polished to be flat; and then the resultant heat-homogenizing plate 2 is parted from the resin plate to give a heat-homogenizing plate 2 with the desired projection height H, as shown in FIG. 2B. The major surface made to be convex by such processes may be used as the mounting surface 3.

Another method for adjusting the projection height of a heat-homogenizing plate 2 is as follows: in the case of a substrate employing a heating element over an insulating layer, as being described later, a substrate is formed by properly bending utilizing the shrinkage difference of the insulating layer 4 and the substrate.

A ceramic material to be used for this embodiment is silicon carbide, silicon nitride, aluminum nitride, boron nitride, boron carbide, or alumina.

As the silicon carbide ceramic, α-type and β-type silicon carbide may be employed. The silicon carbide ceramic includes a sintered body of silicon carbide as a main component and boron (B) and carbon (C) added to the main component as sintering aid. The silicon carbide ceramic may be a sintered body produced from a mixture of mainly silicon carbide and containing alumina ($Al_2O_3$) and yttria ($Y_2O_3$) by sintering at 1,900° C. to 2,200° C.

As the boron carbide ceramic, a sintered body can be obtained from a mixture containing boron carbide as a main component and 3 to 10 wt. % of carbon as a sintering agent by hot-press sintering at 2,000 to 2,200° C. As the boron nitride ceramic, a sintered body can be produced from a mixture containing boron nitride as a main component and, for example, 30 to 45 wt. % of aluminum nitride and 5 to 10 wt. % of rare earth oxides as sintering agents by hot-press sintering at 1,900 to 2,100° C. The boron nitride sintered body may be produced by another method of sintering using a borosilicate glass as a sintering agent, however in this case, the thermal conductivity is considerably decreased and therefore the method is not preferable.

For the silicon nitride ceramic, a sintered body can be produced from a mixture containing boron nitride as a main component, 3 to 12 wt. % of rare earth oxides and 0.5 to 3 wt. % of $Al_2O_3$ as sintering aides and further $SiO_2$ in a proper amount to control the $SiO_2$ content in the resultant sintered body to be 1.5 to 5 wt. % by hot-press sintering at 1,650 to 1,750° C. The $SiO_2$ content means the sum of the $SiO_2$ produced from impurity oxygen contained in the silicon nitride raw material, $SiO_2$ as an impurity contained in other additives, and the intentionally added $SiO_2$.

The aluminum nitride-based ceramic can be produced by sufficiently mixing aluminum nitride as a main component and rare earth oxides such as $Y_2O_3$ and $Yb_2O_3$ and, if necessary, alkaline earth oxides such as CaO, processing the mixture into a flat plate, and sintering the resultant plate at 1,900 to 2,100° C. in nitrogen gas.

Embodiment 2

Another embodiment is relevant especially to a wafer heating apparatus comprising a heat-homogenizing plate made of a substrate using silicon carbide. Since silicon carbide has a semiconductive property, heat radiating bodies, constituting a heating element, are formed on an insulating layer formed on the substrate and insulated from the substrate.

Figure 3:
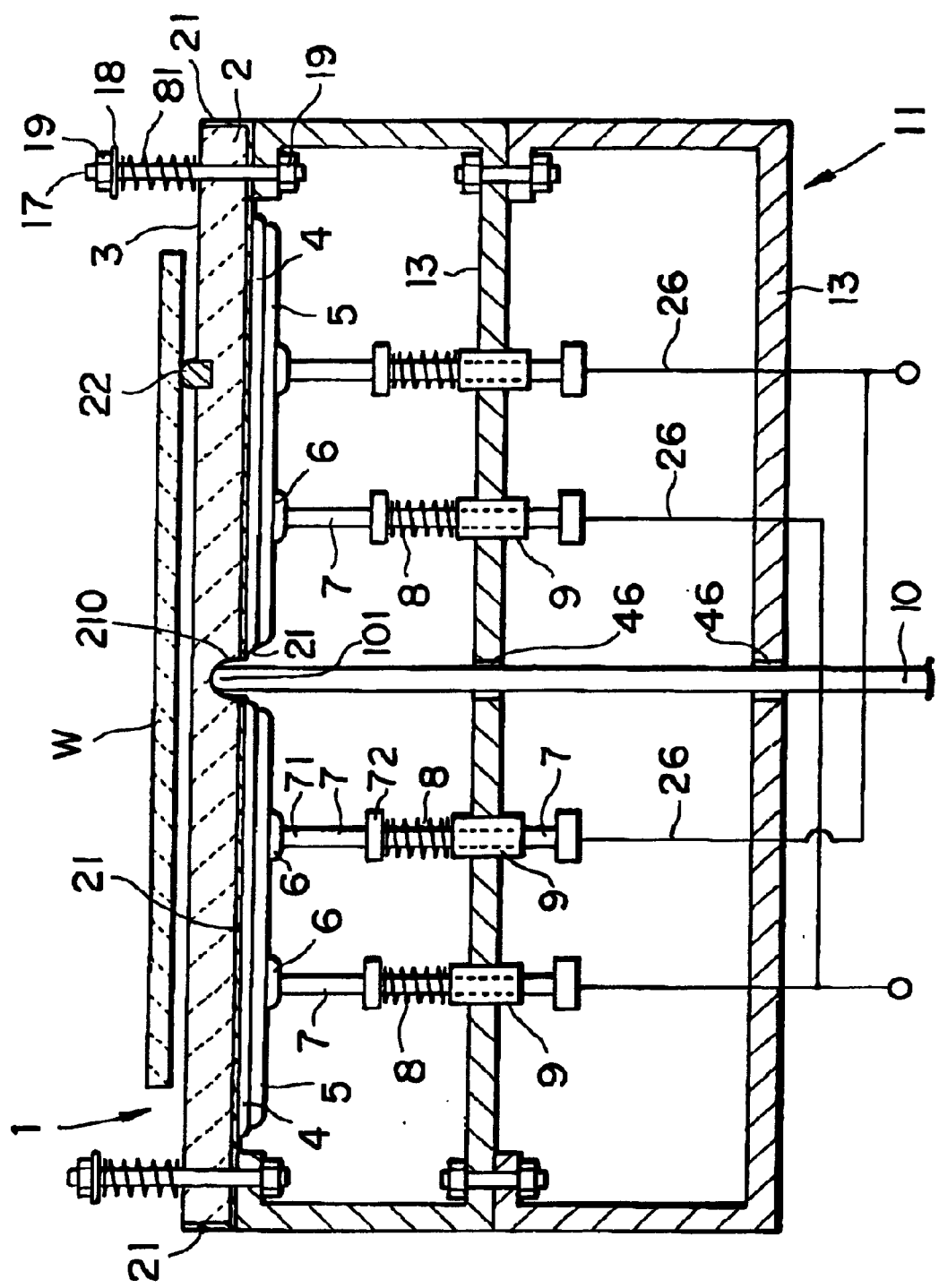
FIG. 3 shows a cross-sectional view of a wafer heating apparatus relevant to another embodiment of the present invention.
Figure 4:
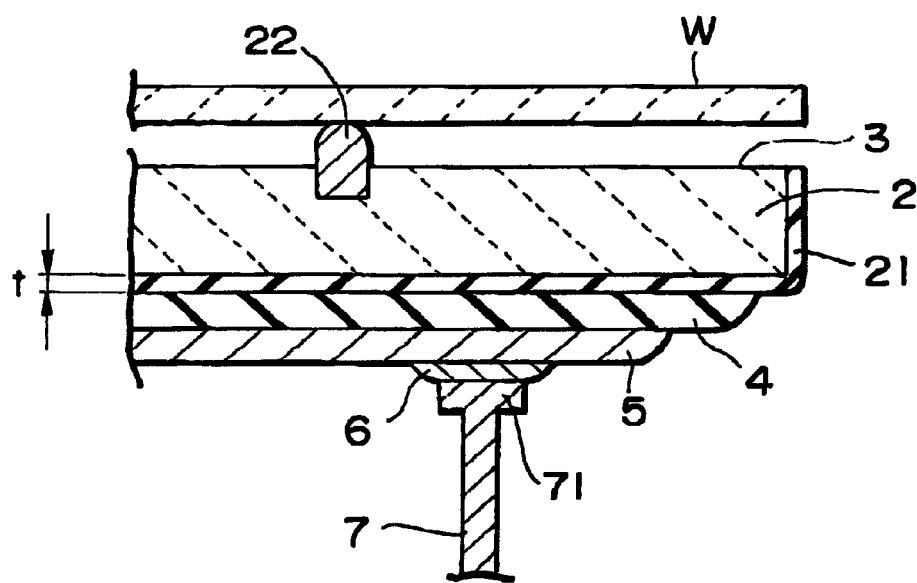
FIG. 4 shows a partly magnified view of the wafer heating apparatus shown in FIG. 3.

An example of this embodiment is shown in FIG. 3 and FIG. 4. The exemplified wafer heating apparatus 1 comprises a ceramic heater so composed by using an upper face of a heat-homogenizing plate 2 made of a ceramic plate-like body of silicon carbide as a main component as a mounting surface 3 to put a wafer W thereon, forming a glass insulating layer 4 on the lower face of the heat-homogenizing plate, forming heat radiating bodies 5 as a heating element on the insulating layer 4, and installing power input pad electrodes 6 further on the insulating layer 4 as to be electrically connected to the heat radiating bodies 5 of the heating element.

In this example, as same as the example shown in the FIG. 1, a plurality of supporting pins 20 are installed in the foregoing mounting surface 3 to mount a wafer W thereon and keep the wafer W at a gap from the mounting surface 3. Consequently, the wafer W is prevented from being partially brought into contact with the heat-homogenizing plate 2, thus avoiding uneven temperature distribution is avoided.

Figure 7:
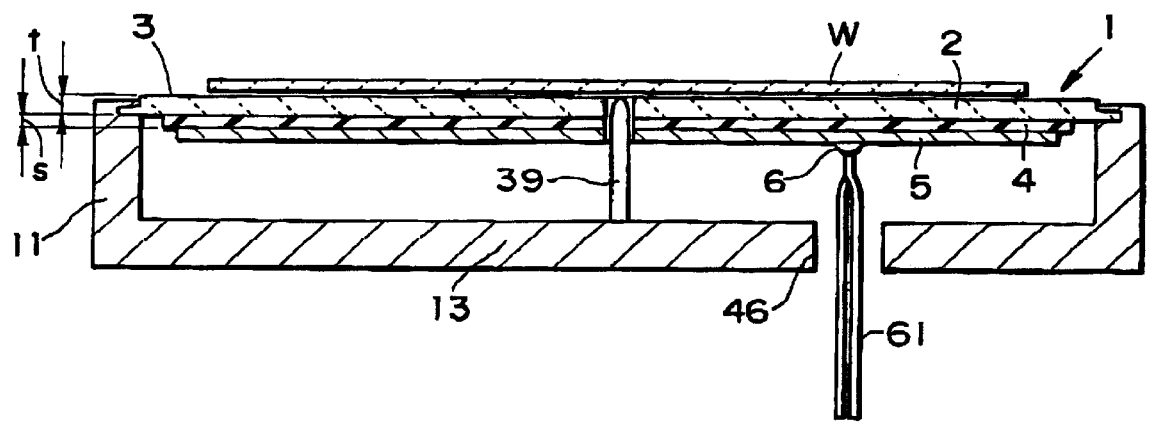
FIG. 7 shows a cross-sectional view of a wafer heating apparatus relevant to another embodiment of the present invention.

Modification of this embodiment is possible and as shown in FIG. 7, a wafer W may be mounted directly on a flat mounting surface 3 of a heat-homogenizing plate 2 to be heated by directly transmitted heat by the heating element 5 formed on the surface of an insulating layer 4 formed in the lower face side of the heat-homogenizing plate. In the FIG. 7, the lower face side of the heat-homogenizing plate 2 is protected by a cover or a partitioning plate 13 surrounding the insulating layer 4 and the heating element 5. In the partitioning plate 13, lift pins 39 are so inserted as to move upwardly from the center part to put a wafer W on and out the mounting surface 3. Lead wires 61 are further soldered directly to the heating element 5 at the pads 6 to supply electric power.

Figure 10:
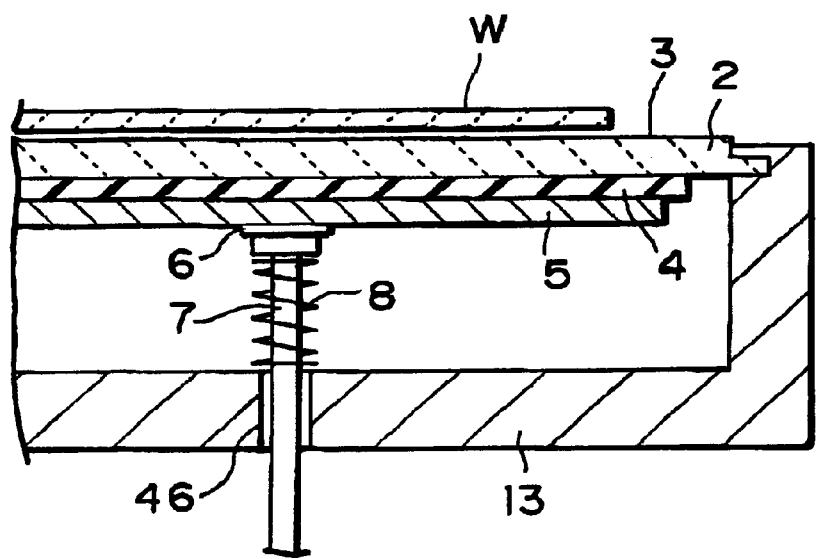
FIG. 10 shows a partial cross-sectional view of a wafer heating apparatus relevant to the other embodiment of the present invention and a partial cross-sectional view of power supply mechanism utilized for the apparatus.
Figure 11:
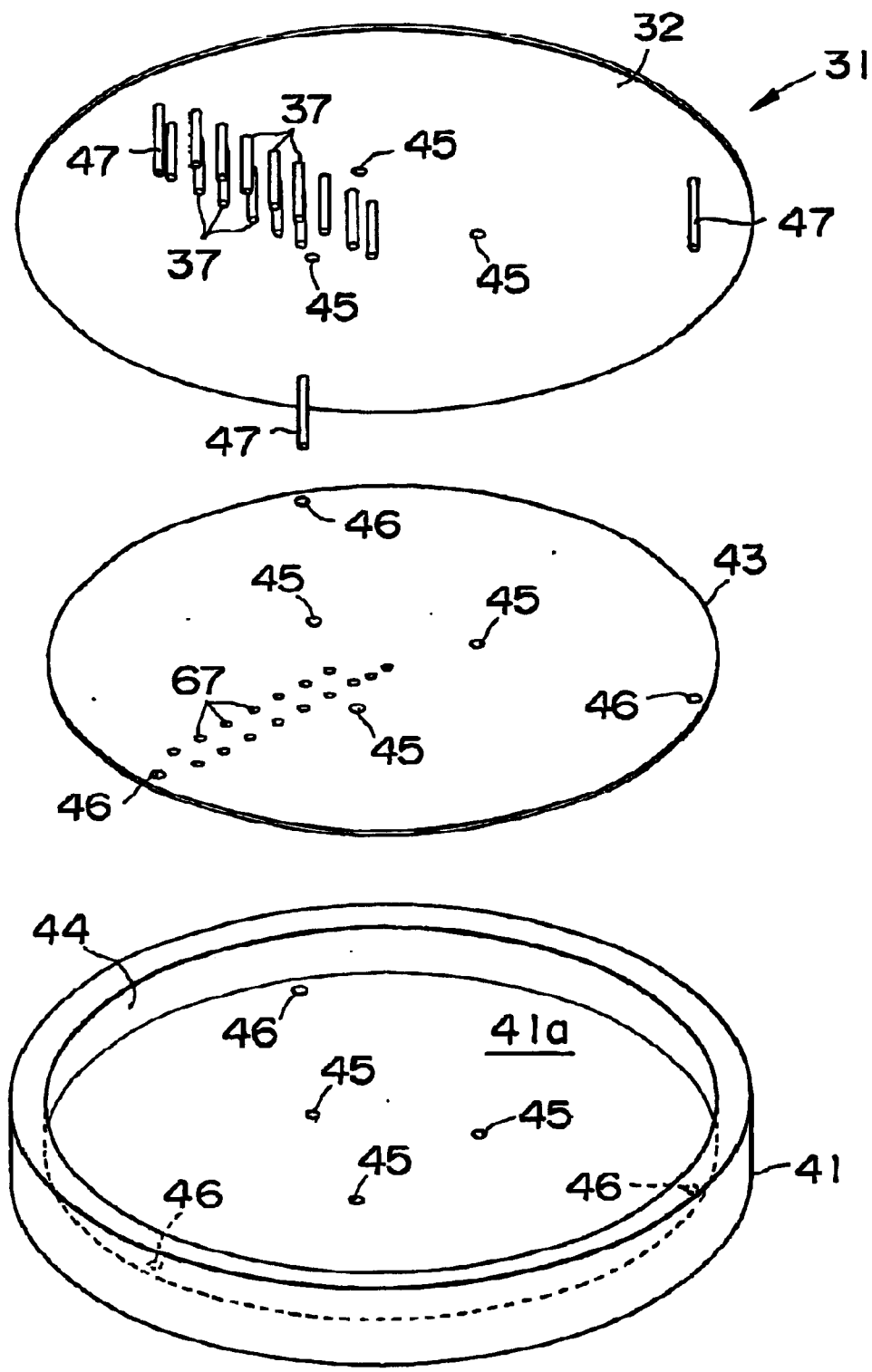
FIG. 11 shows a disassembled figure of a conventional wafer heating apparatus.
Figure 12:
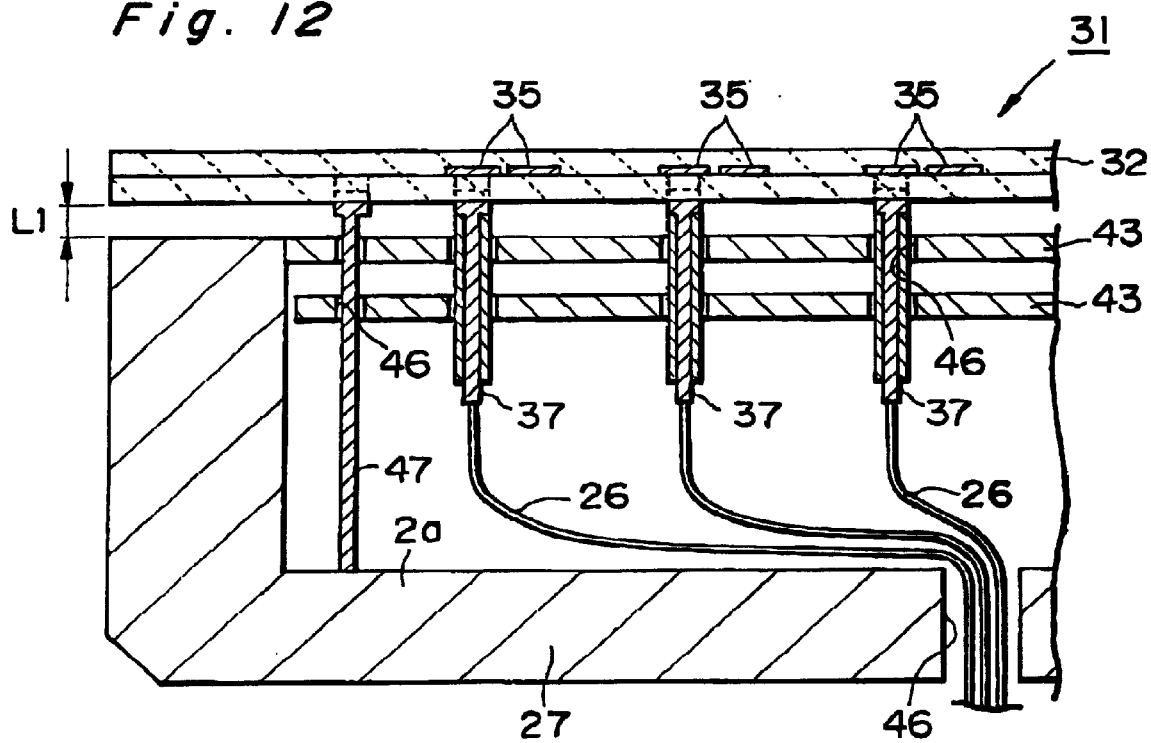
FIG. 12 shows a partial cross-sectional view of a wafer heating apparatus shown in FIG. 11.
Figure 13:
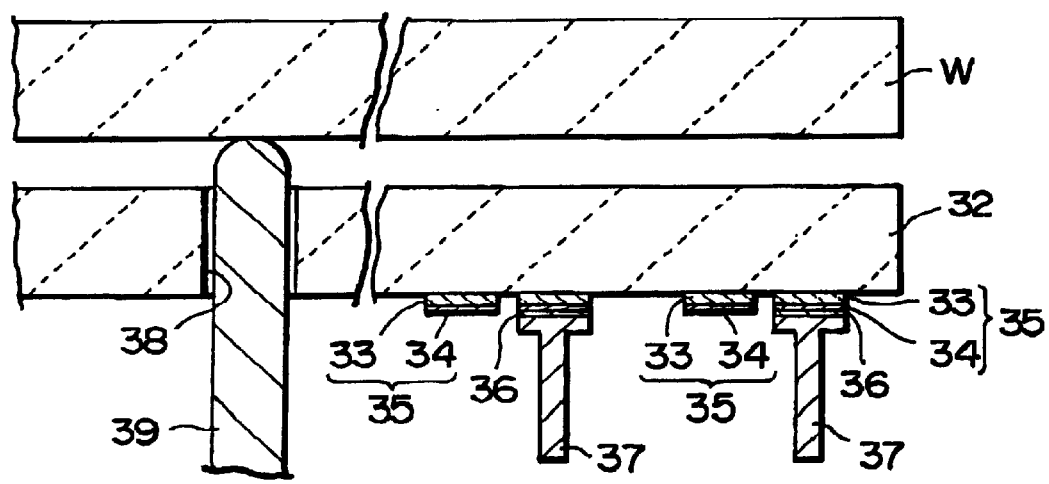
FIG. 13 shows a cross-sectional view showing a power supply mechanism of a conventional wafer heating apparatus.
Figure 14:
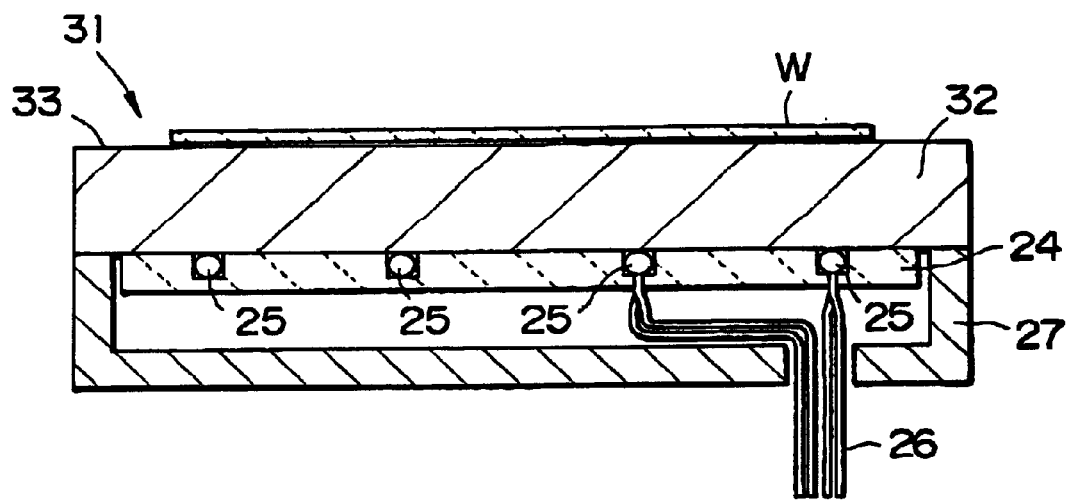
FIG. 14 shows a partial cross-sectional view of a conventional wafer heating apparatus.
Figure 15:
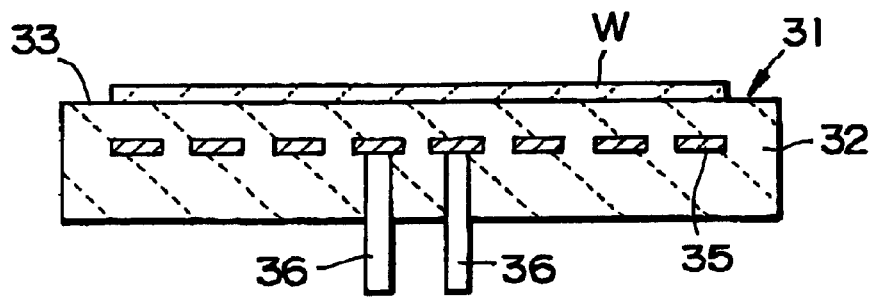
FIG. 15 shows a cross-sectional view of a ceramic heater employed for a conventional wafer heating apparatus.

FIG. 10 shows a variant of the embodiment of FIG. 7, and a pair of power input bar-like terminals 7, one of which is shown, are used as leads to bring the head of each terminal 7 in contact with the respective pad 6 as electrodes, with the terminals forced by springs 8 toward the pads against an opening 46 formed through the partitioning plate 13.

In this embodiment, it is preferable for heat-homogenizing plate 2 of a ceramic substrate to have 2 to 7 mm thickness and for the insulating layer 4 to be made of glass having a thermal expansion coefficient within a range of $3.2\times10^{-6}$/K to $4.4\times10^{-6}$/K in a range of 0° C. to 200° C. and to have 100 to 350 μm thickness.

If the thickness of the heat-homogenizing plate 2 is thinner than 2 mm, the plate is too thin to evenly distribute heat in the whole surface area and if the thickness is thicker than 7 mm, the heat capacity of the heat-homogenizing plate is too high to quickly increase the temperature.

If the thermal expansion coefficient of the glass insulating layer is out of the range of $3.2\times10^{-6}$/K to $4.4\times10^{-6}$/K, the difference of the thermal expansion coefficient of the insulating layer from that of silicon carbide of the heat-homogenizing plate or boron carbide of the substrate is so high that cracking may take place in the insulating layer on the heat-homogenizing plate with the defined thickness or the insulating layer may possibly be parted from the plate in the cooling process during glass baking heating. The thickness of the insulating layer is limited to 100 μm as the thinnest limit from a viewpoint of dielectric breakdown and to 350 μm as the thickest limit attributed to the possibility of deformation of the heat-homogenizing plate with the defined thickness by the shrinkage difference and damages of the insulating layer itself at the time of cooling.

The insulating layer may be formed using a synthetic resin, especially, having a heat resistance, such as a polyimide resin. Especially, in the case where a polyimide resin is used for the insulating layer, the thickness of the insulating layer may preferably be 30 to 150 μm. The lower limit of 30 μm is determined based on the withstand voltage as high as 1.5 kV or higher and if the lower thickness than the lower limit causes dielectric breakdown easily to occur at the time of trimming of the heating element for adjusting the electric resistance of the heat radiating body.

On the other hand, the upper limit is determined to be 150 μm since if the thickness exceeds 150 μm, evaporation of a solvent and vapor increases at the time of baking the resin to result in undesirable expansion and separation between the substrate and the resin film. Such partial separation leads to thermal conductivity deterioration in the part and consequently inhibits even heating of the heat-homogenizing plate. The further desirable thickness of the resin insulating layer may be 60 to 150 μm.

In this embodiment, the insulating layer 4 is formed by melting glass on the surface of the sintered heat-homogenizing plate 2 by heating the heat-homogenizing plate and during the cooling process, deformation is caused owing to the difference of the thermal expansion coefficients of the insulating layer 4 and heat-homogenizing plate 2.

In this embodiment, glass is so selected as to have a thermal expansion coefficient smaller than that of the heat-homogenizing plate 2, hence the heat-homogenizing plate 2 is shrunk more in the front side where the insulating layer 4 is formed based on the relatively high shrinkage at the time of cooling the glass to deform the heat-homogenizing plate. As a result, the heat-homogenizing plate 2, as shown in the FIG. 2A, can be deformed as to have a convex shape in the mounting surface 3 side. In such a manner, the projection height H can be adjusted by utilizing the warping deformation attributed to thermal shrinkage.

In this embodiment, the expansion coefficient of the glass forming the insulating layer 4 is adjusted to be smaller than that of silicon carbide-based substrate, which is the heat-homogenizing plate 2, by $0.2\times10^{-6}$/K to $0.7\times10^{-6}$/K. Consequently, the mounting surface 3 side of the heat-homogenizing plate 2 can be made to be a convex face with a projection height in the foregoing preferable range.

By controlling the thickness of the silicon carbide-based heat-homogenizing plate to be within a range of 1 to 7 mm, the response to the temperature can be improved. The thickness is further preferably 2 to 5 mm. If the thickness of the heat-homogenizing plate 2 is thinner than 1 mm, the rigidity of heat-homogenizing plate 2 is insufficient and the heat-homogenizing plate 2 easily sags. Especially, if the thickness is as thin as less than a millimeter order, the foregoing projection height H of the heat-homogenizing plate 2 becomes high, so that it is not preferable. If the thickness of the heat-homogenizing plate 2 exceeds 7 mm, the responding speed to the alteration of the temperature during the wafer treatment is delayed, so that it is not preferable.

Figure 5:
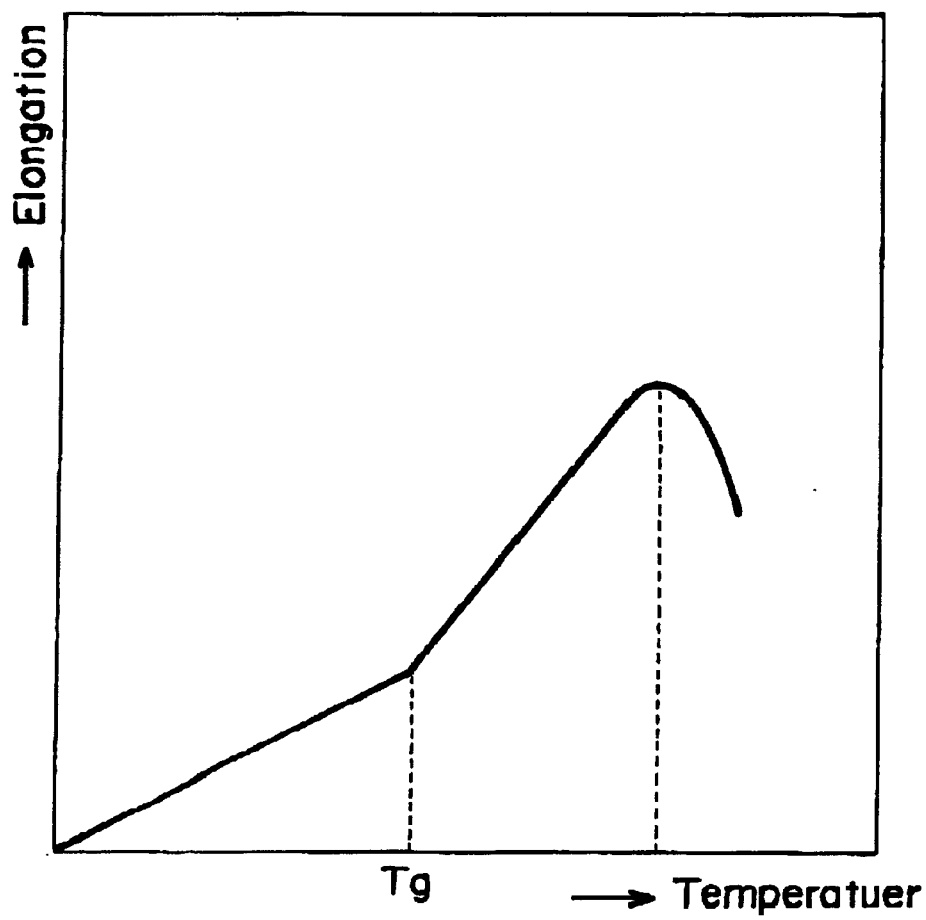
FIG. 5 is a general diagrammatic figure of a thermal expansion curve of glass to be used for an insulating layer.

The thermal expansion property of glass to be used for the insulating layer is diagrammatically shown in FIG. 5 as the alteration of the thermal expansion degree (elongation) in relation to the temperature. With the increase of the temperature, the inclination of the elongation is relatively moderate in a low temperature side, whereas the inclination of the elongation is sharp when the temperature exceeds the glass transition temperature (Tg) and the elongation reaches to the maximum and then tends to decrease. In general, the expansion coefficient of glass means the expansion coefficient in the low temperature side to the Tg.

However, if the glass is heated further exceeding Tg, the apparent expansion coefficient tends to increase. As a matter of fact, in the case where a glass insulating layer 4 is formed on a heat-homogenizing plate 2, heating treatment is carried out at the temperature not lower than the inflection point in the left side in FIG. 5, so that the practical expansion coefficient affecting the warping becomes higher than the value of the expansion coefficient at the temperature to the glass transition temperature. In the present invention, evaluation is carried out based on the average value of the respective expansion coefficients of the glass of the insulating layer and the ceramic material for the heat-homogenizing plate in a range of 0 to 200° C.

Generally, as for the thickness of the substrate of the heat-homogenizing plate 2, by making the ceramic substrate thicker, the effect of the thermal expansion difference of the insulating layer 4, the heating element 5, and an overcoat layer (not shown) from that of the ceramic substrate upon the deformation can be moderated or neglected, however the heat capacity is contrary heightened to take a long time to stabilize the temperature at the time when the setting temperature is changed. Consequently, the substrate is made thin within the foregoing range to heighten the thermal response, to keep the upward convex face relevant to the foregoing deformation and to perform uniform heating the whole wide surface area of a large wafer.

Embodiment 3

Although, in the lower face side of a heat-homogenizing plate of silicon carbide substrate, that is, the face to form a heating element thereon, a glass insulating layer is to be formed as described above, the glass insulating layer has poor wettability to silicon carbide, so that a sufficiently high adhesion strength cannot be obtained. Another embodiment of the present invention, therefore, involves previous formation of a silicon oxide film on the surface of the silicon carbide substrate and formation of the glass insulating layer on the silicon oxide film.

In the present invention, the silicon oxide ($SiO_2$) film 23 is basically amorphous and the thickness of the film is preferably 0.05 to 2.0 µm and especially preferably 0.1 to 1.0 µm. With the thickness within the defined range, the layer can stably be formed on the surface of the silicon carbide ceramic and a high adhesion strength can be obtained.

If the silicon oxide film is thinner than 0.05 µm, the glass layer formed thereon to be the glass insulating layer 4 absorbs the silicon oxide film 23 on the surface to result in inferior adhesion to the heat-homogenizing plate 2 even if being brought into contact with the plate, so that it is not preferable.

On the other hand, if the thickness of the silicon oxide film 23 is made thicker than 2.0 µm, cristobalite phase increases in the silicon oxide film 23 to result in deterioration of the adhesion strength of the insulating layer 4, so that it is not preferable. Taking the reliability and the productivity into consideration, the thickness t of the silicon oxide film 23 is further preferably 0.1 to 1.0 µm.

The silicon oxide film 23 should be kept in amorphous state, however if the film is thick, crystals such as quartz, cristobalite, and tridymite, and precipitated in the silicon oxide film 23 when the silicon oxide film 23 is gradually cooled. Especially, cristobalite has a transformation point between the α-phase and the β-phase accompanied with large volume alteration at 180 to 270° C. and during the transition through the temperature range, the cracking takes place in the silicon oxide film 23, so that such a crystal phase is undesirable.

In formation of the silicon oxide film 23, silicon carbide ceramic substrate is polished at first to be 10 µm or finer flatness an then heated in an oxidizing atmosphere at 1,200 to 1,600° C. for 1 to 12 hours to adjust the thickness of the silicon oxide film, Since the oxygen diffusion in the silicon oxide film 23 is extremely slow, it is necessary to carry out heating treatment in the oxidizing atmosphere at a high temperature in order to form the silicon oxide film 23 with the foregoing thickness on the surface of the silicon carbide ceramic.

After the foregoing oxidizing heating, cooling at a rate higher than 200° C./h is carried out at least in a temperature range from 1,000 to 600° C. Consequently, the cristobalite crystal formation can be suppressed and an amorphous silicon oxide film 3 can be formed.

Embodiment 4

In this embodiment, the x-ray diffraction intensity of crystal plane (101) of cristobalite, which is a crystal phase contained in a silicon oxide film 21, is restricted to 10% or lower than the reflection intensity of the crystal plane (102) of silicon carbide by x-ray diffraction. That can provide excellent stability of the silicon oxide film and heating element on a substrate for a long duration.

Incidentally, the x-ray diffraction intensity means the diffraction intensity of each plane obtained by radiating x-ray beam to the periphery of the substrate surface containing the silicon oxide film and hereafter, the diffraction intensity is expressed as the peak height of each crystal plane in an x-ray diffraction chart.

The ratio of the peak height is undesirable to exceed 10%. The reason for that is because cracking occurs in the insulating layer 4 in a heating cycle test or the insulating layer 4 is easy to be parted and the heating element 5 is disconnected.

Although the (102) plane, which has the main peak of α-silicon carbide, which has a hexagonal crystal system, is exemplified as the crystal phase of silicon carbide, actually there are crystal systems other than silicon carbide having peaks overlapped on the peaks and all of the crystal systems are represented with the peak of silicon carbide.

Tridymite is sometimes produced when the silicon oxide film 21 is gradually cooled near the temperature of 1,470 to 1,570° C. In this case, since tridymite also has a transformation temperature between the α-phase and the β-phase accompanied with the volume alteration near the temperature of 110 to 165° C., it is also undesirable to produce tridymite in the silicon oxide film 21.

Figure 6:
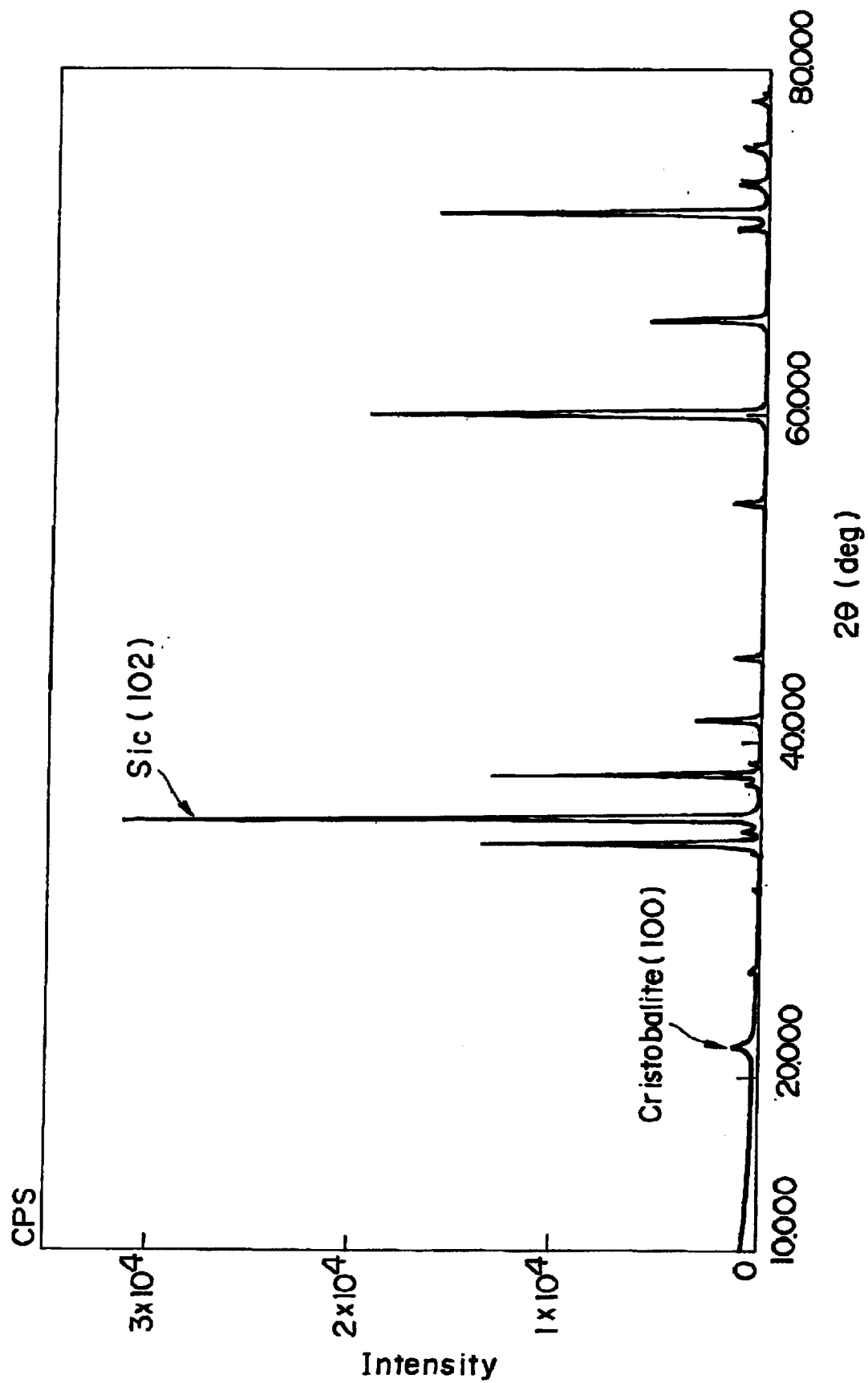
FIG. 6 shows a chart of an x-ray diffraction from a heat-homogenizing plate made of SiC having a $SiO_2$ layer formed thereon to which an X-ray is incident.

One example of an x-ray diffraction peak of silicon carbide on the surface of which the silicon oxide film 21 of the present invention is illustrated in FIG. 6. The peak appointed with an arrow in the left side of the Figure is the peak of the (101) plane, which is the main peak of the cristobalite and the peak expressed as SiC(102) in the upper part is the peak of the (102) plane of silicon carbide.

The method for forming the silicon oxide film 21 is carried out as follows: a heat-homogenizing plate 2 made of silicon carbide is polished to have flatness of 100 µm or finer and after that subjected to treatment at 1,200 to 1,600° C. for 1 to 12 hours in an oxidizing atmosphere and then cooled at a cooling rate higher than 200° C./h at least in a temperature range from 1,000 to 600° C. in cooling process to consequently form the silicon oxide film 21 with suppressed cristobalite crystal formation.

Since the oxygen diffusion in the silicon oxide film 21 is extremely slow, it is necessary to carry out heating treatment in the oxidizing atmosphere at a high temperature in such a manner in order to form the silicon oxide film 21 with the foregoing thickness on the surface of the heat-homogenizing plate 2 of the silicon carbide ceramic. The silicon oxide film 23 is formed by the heating treatment in the oxidizing atmosphere.

The glass insulating layer 4 to be formed on the silicon oxide coating preferably has 10 to 600 µm. With the thickness of 10 µm or thinner, the electric insulation between the heat-homogenizing plate 2 and the heating element 5 is insufficient. With the thickness of 600 µm or thicker, the heat transmission from the heating element 5 to the wafer W mounting surface 3 is delayed attributed to the low thermal conductivity of glass, so that it is not preferable.

The glass insulating layer 4 is preferable to have a surface with 300 µm or finer flatness. That is, since the flatness rougher than 300 µm results in unevenness of the thickness to break resistance distribution of the heating element 5 at the time of forming the heating element 5 on the surface of the insulating layer 4 by a printing method.

In order to make the flatness of the glass insulating layer 4 300 µm or finer, the flatness of the silicon carbide ceramic of the heat-homogenizing plate 2 is controlled to be 300 µm or finer in the side to form the insulating layer 4 thereon and the expansion coefficient of the glass is controlled to be $3.0 \times 10^{-6}$/K to $3.6 \times 10^{-6}$/K in relation to $3.9 \times 10^{-6}$/K of the expansion coefficient of the silicon carbide ceramic.

That is because the stress attributed to shrinkage at the time of sintering the glass is not sufficiently moderated by the heating treatment at the time of baking and the warp to form the concave face in the insulating layer 4 side easily remains. In such a manner, by controlling the expansion coefficient of the glass to be smaller than that of the silicon carbide ceramic, the warp of the heat-homogenizing plate 2 can be suppressed and the flatness is efficiently improved.

If the flatness of the insulating layer 4 is 300 µm or rougher, the heating element 5 for which film thickness is previously controlled are formed in a transfer sheet and the heating element 5 is formed on the insulating layer 4 by transfer to make the thickness even and to enable the resultant heat-homogenizing plate 2 to heat evenly.

The glass insulating layer 4 is formed by forming a film with a prescribed thickness by a printing or transfer method and heating the resultant film at a temperature not lower than the working point of the glass. It is preferable to set the expansion coefficient of the glass to be $3.0 \times 10^{-6}$/K to $3.6 \times 10^{6}$/K slightly smaller than the expansion coefficient of silicon carbide, $3.9 \times 10^{-6}$/K. That is because the stress by shrinkage at the time of sintering and melting glass is not sufficiently moderated and remains to cause the warp. In order to absorb the remaining stress, the expansion coefficient of the glass is made slightly smaller than that of silicon carbide. As a result, the stress remaining in the glass is converted to compressive stress and cracks are hardly caused by the thermal stress.

The heating element 5 is formed on an insulating layer in a prescribed pattern of a metal such as gold, silver, palladium Pd, platinum Pt, and other platinum-group metals such as ruthenium Ru, rhodium Rh, palladium Pd, rhenium Re, osmium Os, Iridium Ir. The heating element 5 may contain glass to enhance adhesion strength to the insulating layer 4.

In details, as the heating element 5, a metal simple substance of such as gold (Au), silver (Ag), copper (Cu), palladium (Pd), and the likes is either directly deposited by an evaporation method or a plating method, or a resin paste or a glass paste containing a metal simple substance or an oxide such as rhenium (Re203) and lanthanum manganate (LaMn03) as a conductive material is produced to form the resistors. The heating element 5 is formed by printing the paste in a prescribed pattern by a screen printing method or the like and then baking the paste as to bind the conductive material with a matrix composed of resin and glass. In the case glass is employed as the matrix, either crystalline glass or amorphous glass may be usable and in order to suppress the alteration of the resistance value by heating cycles, the crystalline glass is preferable to be used.

The glass to be mixed in the heating element is preferable to have a softening temperature (Tg) lower than the glass transition temperature of the glass contained in the insulating layer 4 in order to improve the processing precision of the heating element 5. If the glass has the softening temperature not lower than the glass transition temperature, the glass has viscous fluidity, so that the softening temperature of the glass contained in the heating element 5 is controlled to be lower to avoid bad effect, e.g. deformation and contamination, on the insulating layer 4 at the time of baking the heating element 5.

The heating element 5 is formed on the lower face of a heat-homogenizing plate directly or through the foregoing insulating layer in a prescribed pattern by application or deposition. The pattern, as shown in FIGS. 8 and 9, may be concentric or spiral composed of arc-like electrode parts and linear electrode parts and is to be a pattern capable of evenly heating the mounting surface 3. In order to improve the evenly heating property, the heating element 5 may be divided into a plurality of patterns.

The heating element 5 is, as described above, made of gold, silver, or a metal of platinum-group metals including ruthenium Ru, rhodium Rh, palladium Pd, rhenium Re, osmium Os, Iridium Ir and platinum Pt, and trimmed if necessary to adjust the resistance distribution in the whole pattern to improve the evenly heating property.

The infrared ray emissivity of the wafer-mounting surface 3 is preferably 80% or higher. Consequently, the heat of the heat-homogenizing plate 2 can be emitted at high efficiency in a form of far infrared rays to a wafer W from the mounting surface 3, so that the surface temperature of the mounting surface 3 is easily kept constant and the heating efficiency of the wafer W is heightened.

Especially, regarding silicon carbide ceramic to be employed for the heat-homogenizing plate, there is available a ceramic of mainly silicon carbide produced using carbon and boron carbide as sintering aids. Also available as a another silicon carbide ceramic is a ceramic of silicon carbide additionally containing $Al_2O_3$ and $Y_2O_3$. Further, the silicon carbide ceramic may be produced by reactive sintering involving carbonization of a Si molded body by treatment in a carbon-type gas.

The free-carbon-containing silicon carbide is generally blacken owing to the remaining carbon particles and also, $Al_2O_3$—$Y_2O_3$-containing silicon carbide system increases in infrared ray absorptivity due to solid solution of Al in the silicon carbide to increase the infrared ray emissivity to 80% or higher. The silicon carbide produced by reactive sintering is sometimes colored to be yellow green to gray based on the reactive sintering state. In this case, the infrared ray emissivity can be increased to 80% or higher by spraying a material with a high infrared ray emissivity, e.g., cordierite, or by forming silicon carbide coating on the surface by CVD method.

In FIGS. 1 and 3, the heat-homogenizing plate 2 is elastically pressed fixedly by inserting bolt 17 on the upper periphery of a supporting body 11 on the heat-homogenizing plate side, using an elastic member including a coil spring 81, with a washer 18 encircled around the bolt 17 which extends in the coil spring 81 through the heat-homogenizing plate and through an inner flange of the upper side of the supporting body 11, and nuts 19 to screw the both ends of the bolt. Consequently, even if the supporting body 11 is deformed at the time when the temperature of the heat-homogenizing plate 2 is changed or the temperature of the heat-homogenizing plate 2 is fluctuated by mounting a wafer on the mounting surface 3, the foregoing elastic members 8 absorb the deformation and hence the warp of the heat-homogenizing plate 2 can be prevented and the occurrence of temperature distribution in the surface of the wafer W can be prevented during heating of the wafer W.

A thermocouple 10 is installed closely to the wafer-mounting surface 3 in the center part of the heat-homogenizing plate 2 and the temperature of the heat-homogenizing plate 2 is adjusted based on the temperature data measured by the thermocouple 10 based on the temperature data measured by the thermocouple 10. The heating element 5 may be divided into a plurality of blocks, and in this case, preferably, a plurality of thermocouples 10 for temperature measurement may be installed in the respective blocks of the heating element 5 in order to control the temperature control independently for each block.

As a thermocouple 10, form the point of view of quick temperature response and retention workability, a sheathed type of thermocouples 10 with a sheath 1.0 mm or less in outer diameter is preferable to be employed. A couple tip 101 of each thermocouple 10 is preferable to be fixed, by a small elastic pressing member e.g., a spring member, to attach to the inner wall of a metal tube which is buried in a hole 210 formed in the heat-homogenizing plate 2 as shown in FIGS. 1 and 3, then improving the reliability of the temperature measurement at the heat-homogenizing plate.

The middle portion of each thermocouple 10 may be held using a through holder (like a though holder 9 of insulating material for bar-shaped terminals) through a partitioning plate 13 of a supporting part 7 so as to protect the couple tip 101 of the thermocouple buried in the heat-homogenizing plate 2 from outer stress. FIG. 1 shows only one of the thermocouples arranged in such a way on a heat-homogenizing plate 2.

The supporting body 11 is composed of two parallel partitioning plates 13 and side wall parts, and bar-shaped terminals 7 for supplying electric power to the heating element 5 each are held through a though holder 9 of insulating material passing through an inner partitioning plate 13 and an air jetting inlet and a thermocouple holding part, which are not illustrated, are also installed. The power supply terminals 7 are so composed as to be forced on pad electrodes 6 by the elastic members such as coil springs 8 which is imposed between the flange of the bar-like terminal and the By forming the connection of each pad 6 and each power supply terminal 7 installed in the heat-homogenizing plate 2 by forcing, the difference of the expansion between the heat-homogenizing plate 2 and the supporting body 11 attributed to the temperature difference of both members can be moderated by sliding of the contacting parts of the pad and the terminal, so that the resultant wafer heating apparatus 1 can be provided with excellent durability to heating cycles at the time of use.

By forming the connection of each pad 6 and the respective power supply terminal 7 which is forcing the pad, the difference of the expansion between the heat-homogenizing plate 2 and the supporting body 11 due to the temperature difference of both members can be moderated, so that the resultant wafer heating apparatus 1 can be provided with excellent durability to repeated heat cycles in use. As the elastic members 8 of a pushing means, helical or coil springs as illustrated in FIG. 1 and besides, leaf springs, may be employed to carry out the forcing.

By the pushing force of the elastic members 8, load of 0.3 N or higher may be applied to the respective power supply terminals 7. The reason for application of the pushing force of 0.3 N or higher is to prevent each power supply terminal 7 from parting from the each pad 6 due to the friction of the power supply terminal 7 with the sliding part although the power supply terminal 7 is made to be forced against the pad from the lower face of the heat-homogenizing plate 2 in terms of the constitution of the apparatus and at the same time the communication terminal 7 has to be made movable corresponding to the size alteration owing to the expansion and contraction of the heat-homogenizing plate 2 and the supporting body 11.

The diameter of each power supply terminal 7 in the face side to be brought into contact with each pad 6 is preferably 1.5 to 4 mm. Further, a material usable as the though holder 9 of insulating material for holding the power supply terminal 7 may be selected corresponding to the use temperature and may be PEEK (polyethyloxyethoxy ketone resin) in which glass fibers are dispersed at a 200° C. or lower use temperature and insulating materials of ceramics containing alumina, mullite, and the likes are usable in the case of using at a temperature not lower than that temperature.

In that case, at least the part of each power supply terminal 7 contacting each pad is preferably made of one or more metals selected from Ni, Cr, Ag, Au, a stainless steel, and platinum-group metals. Practically, each power supply terminal 7 itself may be made of the foregoing metals or a coating layer of the foregoing metals may be formed on the surface of the power supply terminals 7.

A metal foil made of the foregoing metals may be inserted between each power supply terminal 7 and each pad 6 and consequently, contact failure owing to the oxidation of the surface of the power supply terminal 7 can be prevented and the durability of the heat-homogenizing plate 2 can be heightened.

The surface of the each power supply terminal 7 is subjected to pre-etching treatment or sand blasting treatment to roughen the surface to prevent the contact from becoming point contact, resulting in further improvement of reliability of the contact. The wafer heating apparatus 1 is so controlled as to make the temperature in the plane of the heat-homogenizing plate 2 even, however the relation of the temperature of the supporting body 9 and that of the heat-homogenizing plate 2 is not constant at the time of, e.g., replacing a wafer with another wafer from a viewpoint of the structure. Owing to the temperature difference, since each pad 6 and each power supply terminal 7 are often brought into contact with each other in twisted positioning relation, uneven contact between them easily place to cause contact failure.

Hence, in order to heat a wafer W by the wafer heating apparatus 1, the wafer W transferred by a transportation arm not illustrated in the figure above the mounting surface 3 is supported by lift pins not illustrated in the figure and then the wafer W is mounted on the mounting surface 3 by moving the lift pins 8 downward.

Next, electric power is supplied to each pad 6 to radiate heat from the heating element 5 and to heat the wafer W on the mounting surface 3 through the insulating layer 4 and the heat-homogenizing plate 2.

The heat-homogenizing plate 2 is, as described above, preferably made of silicon carbide sintered body and the material can be made thin since the material is scarcely deformed by heating and is therefore capable of shortening the time taken to increase the temperature of a prescribed treatment temperature or the time taken to cool the temperature from the prescribed temperature near to a room temperature. That results in high productivity and at the same time, attributed to the heat transmittance not lower than 80 W/m.K, even with a thin thickness, the plate 2 can transmit the Joule heat of the heating element 5 to suppress the temperature dispersion of the mounting surface 3 to an extremely narrow level.

Taking it into consideration to heighten the adhesion strength of the lower side major surface in the reverse side of the mounting surface 3 of the heat-homogenizing plate 2 to the insulating layer 4 made of glass or a resin, the lower side major surface is preferable to be polished to have the flatness preferably 20 $\mu$m or finer and the roughness as center line average roughness (Ra) preferably 0.1 to 0.5 $\mu$m.

On the other hand, in the case silicon carbide sintered body is used for the heat-homogenizing plate 2, glass or resin is possible to be used for the insulating layer 4 for keeping insulation between the heat-homogenizing plate 2 having more or less a conductivity and the heating element 5 and in the case of using glass, if the thickness is thinner than 30 $\mu$m, the withstand voltage is less than 1.5 kV, which is insufficient to keep insulation and contrary, if the thickness exceeds 60 $\mu$m, the thermal expression difference between the silicon carbide sintered body composing the heat-homogenizing plate 2 and an aluminum nitride-based sintered body becomes so high that the cracking takes place in the insulating layer 4 to make the layer impossible to properly function. Since glass has a low thermal conductivity, the heat transmission from the heating element 5 to the wafer mounting surface 3 is delayed. For that, in the case of using glass as the insulating layer 4, the thickness of the insulating layer 4 is preferable to be 10 to 600 μm and further preferable to be 100 to 350 μm.

The glass insulating layer 4 may be formed by forming a film with a constant thickness by a printing or transferring method and then subjecting the resultant film at a temperature not lower than the working point of the glass. In order to control the projection height H of the mounting surface 3 to be 10 to 80 μm, it is preferable to control the flatness of the silicon carbide ceramic in the side where the insulating layer 4 of the heat-homogenizing plate 2 is to be formed to be 20 μm or finer and at the same time it is preferable to form the insulating layer 4 using glass having an expansion coefficient of $3.2 \times 10^{-6}$/K to $3.7 \times 10^{-6}$/K slightly smaller by $0.2 \times 10^{-6}$/K to $0.7 \times 10^{-6}$/K than the expansion coefficient of silicon carbide, $3.9 \times 10^{-6}$/K. That is because the stress by shrinkage at the time of sintering and melting glass is not sufficiently moderated and remains in a form of the warp. In order to absorb the remaining stress, the expansion coefficient of the glass is made slightly smaller than that of silicon carbide. As a result, the stress remaining in the glass is converted to compressive stress and cracks are hardly caused by the thermal stress.

In the case of a heat-homogenizing plate 2 of an aluminum nitride-based ceramic, in order to finely adjust the resistance value distribution of heating element 5, the heating element 5 is preferable to be formed on the surface of the aluminum nitride-based sintered body. In order to heighten the adhesion strength of the heating element 5 to the heat-homogenizing plate 2, a glass insulating layer 4 is preferable to be formed.

As the means for forming the insulating layer 4 made of glass or a resin on the heat-homogenizing plate 2, the following steps may be carried out: a proper amount of a glass paste or a resin paste is dropwise titrated on the center part of the heat-homogenizing plate 2 and spread evenly by a spin coating method or evenly applied to the heat-homogenizing plate 2 by a screen printing method, a dipping method, a spray coating method, and the likes and then baked at 600° C. in the case of using a glass paste and at 300° C. or higher in the case of using a resin paste. In the case of using glass for the insulating layer 4, the heat-homogenizing plate 2 made of silicon carbide sintered body or boron carbide-based sintered body is previously heated to about 1,200° C. to previously oxidize the surface to be coated with the insulating layer 4, so that the adhesion strength of the insulating layer 4 made of glass to the heat-homogenizing plate 2 can be heightened.

Regarding a heat-homogenizing plate 2 of a type containing heating element 5, it is preferable to use an aluminum nitride-based sintered body, which has a high thermal conductivity and high electric insulation property. In this case, raw materials containing aluminum nitride as a main component and proper amounts of sintering aids are sufficiently mixed and formed into a disk-like shape, a paste containing W or WC is printed on the surface of the resultant disk into a pattern of the heating element 5, further another aluminum nitride molded body is overlaid on the resultant disk, and then the obtained body is fired at 1,900 to 2,100° C. in nitrogen gas to obtain a heat-homogenizing plate 2 containing the heating element 5. Power input with the heating element 5 can be formed by forming through holes 19 in the aluminum nitride-based substrate, burying a paste containing W or WC in the through holes and firing the paste, and then leading out electrodes to the surface. Pad electrodes 6 may be formed by applying a paste containing mainly a noble metal such as Au, Ag, or the like, in the case the heating temperature of a wafer W is high, to the upper parts of the through holes and baking the paste at 90 to 1,000° C. to prevent oxidation of the heating element 5 in the inside.

Further, in the case a wafer heating apparatus 1 produced in such a manner is used for resist film formation, it is preferable to use silicon carbide sintered body for the heat-homogenizing plate 2 since the silicon carbide sintered body does not emit ammonia gas attributed to reaction with the moisture of the atmospheric air and therefore does not deteriorate the resist film. In that case, it is required to avoid use of a sintering aid containing nitrides possible to generate ammonia or amines by reaction with water. Consequently, a highly dense and ultrafine wiring can be formed on a wafer W.

EXAMPLES

Example 1

Using a solvent, silicon carbide raw material was mixed with 3 wt. % of B4C, 2 wt. % of C and a proper amount of a binder, granulated, molded at 100 MPa molding pressure and fired at 1,900 to 2,100° C. to obtain a disk-like silicon carbide sintered body with 80 W/m.K thermal conductivity, 230 mm of outer diameter and 3 mm of thickness. After both faces were ground to be flat planes and the respective faces were subjected to heating treatment at 1,100° C. for 1 hour to form films 23 of $SiO_2$ and the a glass insulating layer 4 was formed on one face.

Regarding the glass layer, pastes of glass with adjusted expansion coefficients by changing the mixing ratio of glass with $2.8 \times 10^{-6}$/K of expansion coefficient, glass with $3.8 \times 10^{-6}$/K and glass with $4.8 \times 10^{-6}$/K were made ready and respective pastes were applied to separately to heat-homogenizing plates 2 by printing and baked at 900° C. to form glass insulating layers 4.

After that, in order to form heating element 5 on each insulating layers 4, a glass paste containing a Au powder and a Pd powder as conductive materials were printed in a prescribed pattern by a screen-printing method and then heated to 150° C. to dry out an organic solvent and further subjected to degreasing treatment at 550° C. for 30 minutes and then baked at 700 to 900° C. to form heating element 5 with 50 μm thickness. The heating element 5 were divided by four lines in the center part and the peripheral part in the peripheral direction to have 5 patterns. After that, pad electrodes 6 were fixed in the resultant heating element 5 by a conductive adhesive to manufacture heat-homogenizing plates 2.

Regarding the projection height H of the mounting surface 3 of each heat-homogenizing plate 2, the dispersion of the height of lattice points at 30 mm pitches was measured by a flatness tester (under trade name of "Nanoface" provided by Kyocera Corporation) and the difference between the maximum and the minimum was defined as the warp which was defined as the projection height H.

In such a manner, there were produced samples of heat-homogenizing plates 2 having concave mounting surfaces 3 with projection height of −40 μm, −20 μm, 0 μm, convex mounting surfaces 3 with projection height of 10 μm, 20 μm, 40 μm, 60 μm, 80 μm, and 100 μm.

Regarding a supporting body 11, two sheets of plate-like structure bodies 13 made of JIS SUS 304 with 2.5 mm thickness having opening parts of 30% in one main surface were made ready and in one of the sheets, a thermocouple 10 and ten power supply terminals 7 were installed at prescribed positions and the structure bodies were fixed together with side wall parts made of the same SUS 304 by screwing to obtain each supporting body 11.

After that, on an obtained supporting body 11, a heat-homogenizing plate 2 was overlaid and their outer peripheral parts were fastened by screwing bolt and nuts to obtain a wafer heating apparatus 1 of the present invention as illustrated in FIG. 3.

After each wafer heating apparatus 1 manufactured in such a manner was kept at 80° C. by supplying electric power to the power supply terminals 7, the temperature of the surface of each wafer mounted on each mounting surface 3 was measured at 7 points in total of the center point and 6 points defined by evenly dividing the circumference by six at the ⅔ of the wafer radius from the center and after the temperature dispersion was found within 1° C., the setting temperature was changed to 150° C. Then, the transition characteristic of the temperature dispersion in each wafer face was measured, as the time taken to increase the temperature of each wafer W to 150° C. after each wafer was mounted, for respective samples by repeating 5 cycles. The maximum valves were employed as the measured values.

As the evaluation standard, samples with which the temperature dispersion was suppressed within 10° C. at the time of increasing the temperature of each wafer face were determined to be satisfactory and those with which the temperature dispersion exceeded the defined range were determined to be unsatisfactory. Those which required not longer than 60 seconds to stabilize the temperature within ±1° C. from the keep temperature were determined to be satisfactory and those which requires longer time were determined to be unsatisfactory.

The testing results were as shown in Table 1.

TABLE 1

| No. | | Warp ($\mu$m) | Warping direction of mounting surface side | Distribution at heating transition period (° C.) | Time to stabilize the temperature (second) |
|---|---|---|---|---|---|
| 1 | * | −40 | Concave | 14 | 83 |
| 2 | * | −20 | Concave | 13 | 76 |
| 3 | * | 0 | flat | 11 | 67 |
| 4 | | 10 | Convex | 10 | 60 |
| 5 | | 20 | Convex | 8 | 52 |
| 6 | | 40 | Convex | 6 | 45 |
| 7 | | 60 | Convex | 8 | 51 |
| 8 | | 80 | Convex | 10 | 55 |
| 9 | * | 100 | Convex | 13 | 75 |

* shows the comparison examples.

As being understood from Table 1, the heat-homogenizing plates 2 of No.1 to 3 whose mounting surfaces 3 with projection height H lower then 10 $\mu$m and that of No. 9 with projection height H exceeds 80 $\mu$m showed the temperature dispersion exceeding 10° C. during the transition period to 150° F. from 80° C. and took longer than 60 seconds to stabilize the temperature at 150° C. and therefore these were found undesirable. On the other hand, those of No. 4 to 8 with projection height H within 10 to 80 $\mu$m showed temperature dispersion not wider than 10° C. during the heating transition period and took not longer than 60 seconds to stabilize at 150° C.

Example 2

Investigation was carried out for the correlation of the expansion coefficient difference between a heat-homogenizing plate 2 and glass to form an insulating layer 4 with the projection height H of a mounting surface 3 of a heat-homogenizing plate 2. The expansion coefficient of glass was properly adjusted by properly mixing glass with expansion coefficient 2.8×10$^{-6}$/K, glass with 3.8×10$^{-6}$/K and glass with 4.8×10$^{-6}$/K. Samples were made ready in the same manner as that in the example 1 and the projection height H, the temperature dispersion during the heating transition period, and the time taken to stabilize at the retention temperature were measured in the same manner as that in the example 1.

Green sheets with 5 mm thickness were made ready by laminating 5 green sheets with each 1 mm thickness and containing mainly aluminum nitride and 5 wt % of $Y_2O_3$ as a sintering aid. Heating elements 5 made of WC were formed in a desired pattern on the laminating sheets. Other green sheets produced by layering green sheets to be 5 mm and having via holes filled with a paste containing WC to be electrode leads were closely overlaid on the former green sheets with 5 mm thickness. Disks were cut out of the resultant layered bodies and degreased in nitrogen gas and then fired at 1,900 to 2,100° C. to produce disk-like heat-homogenizing plates 2 made of aluminum nitride.

After that, the expansion coefficient of insulating layers 4 was properly adjusted by properly mixing glass with expansion coefficient 2.9×10$^{-6}$/K, glass with 3.9×10$^{-6}$/K and glass with 4.9×10$^{-6}$/K and samples were made ready in the same manner as that in the example 1. For these samples, the projection height H, the temperature dispersion during the heating transition period, and the time taken to stabilize at the retention temperature were measured in the same manner as that in the example 3. The thickness of the insulating layers 4 was controlled to be 200 $\mu$m.

The results were shown in Table 2.

TABLE 2

| No. | Material of heat-homogenizing plate | thickness of the heat-homogenizing plate (mm) | Thermal expansion coefficient of heat-homogenizing plate (10$^{-6}$/° C.) | Thermal expansion coefficient of glass (10$^{-6}$/° C.) | Difference of thermal expansion coefficient (10$^{-6}$/° C.) | Warp of heat-homogenizing plate ($\mu$m) | Temperature distribution at heating transition period (° C.) | stabilizing time of temperature (second) |
|---|---|---|---|---|---|---|---|---|
| 1 | SiC | 2.5 | 3.9 | 3.9 | 0 | 0 | 12 | 48 |
| 2 | | | | 3.7 | 0.2 | 10 | 10 | 45 |
| 3 | | | | 3.5 | 0.4 | 35 | 5 | 40 |
| 4 | | | | 3.2 | 0.7 | 80 | 10 | 60 |

TABLE 2-continued

| No. | Material of heat-homogenizing plate | thickness of the heat-homogenizing plate (mm) | Thermal expansion coefficient of heat-homogenizing plate ($10^{-6}/°C.$) | Thermal expansion coefficient of glass ($10^{-6}/°C.$) | Difference of thermal expansion coefficient ($10^{-6}/°C.$) | Warp of heat-homogenizing plate ($\mu$m) | Temperature distribution at heating transition period (°C.) | stabilizing time of temperature (second) |
|---|---|---|---|---|---|---|---|---|
| 5 |  | 4.0 |  | 3.2 | 0.7 | 80 | 9 | 50 |
| 6 |  | 2.5 |  | 3.0 | 0.9 | 90 | 13 | 65 |
| 7 | AlN | 2.5 | 5.0 | 5.0 | 0 | 0 | 12 | 49 |
| 8 |  |  |  | 4.8 | 0.2 | 10 | 10 | 45 |
| 9 |  |  |  | 4.6 | 0.4 | 35 | 6 | 41 |
| 10 |  |  |  | 4.3 | 0.7 | 80 | 9 | 58 |
| 11 |  | 4.0 |  | 4.3 | 0.7 | 60 | 9 | 60 |
| 12 |  | 2.5 |  | 4.1 | 0.9 | 90 | 14 | 64 |

As shown in Table 2, the heat-homogenizing plates 2 of Sample Nos. 6 and 12 with the expansion coefficient of glass smaller than that of the substrate by more than $0.7 \times 10^{-6}$/K showed projection height H 90 $\mu$m and those Samples Nos. 1 and 7 with the difference of the expansion coefficient of glass from that of the substrates smaller than $0.2 \times 10^{-6}$/K showed projection height H=0 $\mu$m and any one of them showed the temperature dispersion exceeding 10° C. during the heating transition time and took longer than 60 seconds to stabilize the temperature. On the other hand, those Sample Nos. 2 to 5, and Nos. 8 to 11 with the difference of the expansion coefficient of glass from that of the substrates within a range from $0.2 \times 10^{-6}$/K to $0.7 \times 10^{-6}$/K showed the projection height H within 10 to 80 $\mu$m, showed the temperature dispersion not wider than 10° C. during the heating transition period, and took not longer than 60 seconds to find they have excellent properties.

Example 3

Disk-like silicon carbide sintered bodies with 230 mm outer diameter and 80 W/m.K thermal conductivity were obtained by mixing silicon carbide raw material with 3 wt. % of B4C and 2 wt. % of C and a proper amount of a binder in a solvent, granulating the resultant mixture, molding the mixture at 100 MPa molding pressure, and firing the molded bodies at 1,900 to 2,100° C. After both faces of each sintered body were ground to be flat plane, heating treatment at 1,000° C., 1,100° C., 1,200° C., 1,400° C., and 1,600° C. for 1 hour and at 1,600° C. for 2 hours, 4 hours, 8 hours, and 12 hours and at 1,800° C. for 4 hours and 8 hours was separately carried out and cooling at 300° C./h cooling rate at least from 1,000° C. and 600° C. was carried out to form a film 21 of $SiO_2$ on each sample. After that, a glass paste of 200 $\mu$m thickness was formed by printing on one face and baked at 900° C. to form an insulating layer 4 on each sample and then the insulating layer 4 state was observed. The glass employed has expansion coefficient of $3.4 \times 10^{-6}$/K.

Each of the disk-like silicon carbide sintered bodies coated with glass in one side in such a manner was subjected in a heat cycle test repeating 500 cycles which include evenly heating a sample by inserting in a constant temperature oven at 300° C., quenching by blowing air at a room temperature, and again inserting into the oven at 300° C., and after the repeating test, then the glass insulating layer 4 state was observed.

The thickness t of the silicon oxide film 21 formed after heating treatment was measured using an X-ray photoelectron spectrometer (under trade name of "Quantum 2000" provided by ulvac-PHI by sputtering the surface at 18.7 nm/min sputtering rate.

The results were shown in Table 3.

TABLE 3

| No. |  | Treatment temperature (°C.) | Treatment duration (hour) | Thickness of oxidized coating ($\mu$m) | Glass wettability | Durability evaluation |
|---|---|---|---|---|---|---|
| 1 | * | non | — | 0.02 | x | — |
| 2 |  | 800 | — | 0.05 | ○ | ○ |
| 3 |  | 1000 | — | 0.10 | ○ | ○ |
| 4 |  | 1100 | — | 0.13 | ○ | ○ |
| 5 |  | 1200 | — | 0.18 | ○ | ○ |
| 6 |  | 1400 | — | 0.34 | ○ | ○ |
| 7 |  | 1600 | — | 0.69 | ○ | ○ |
| 8 |  | 1600 | 2 | 0.85 | ○ | ○ |
| 9 |  | 1600 | 4 | 1.05 | ○ | ○ |
| 10 |  | 1600 | 8 | 1.15 | ○ | ○ |
| 11 |  | 1600 | 12 | 1.25 | ○ | ○ |
| 12 |  | 1800 | 4 | 1.98 | ○ | ○ |
| 13 | * | 1800 | 8 | 2.28 | ○ | cracks |

* shows the comparison examples.

As being understood from Table 3, the sample of No. 1 without being subjected to the thermal treatment at all had the thickness t of the film 21 of $SiO_2$ formed on the surface is extremely thin, 0.02 $\mu$m, so that the film 21 of $SiO_2$ on the surface was absorbed in the glass at the time of formation of the glass insulating layer 4 and swelling was partly observed. The sample of No. 1 subjected to treatment at 1,800° C. for 8 hours and provided with a 2 $\mu$m thick film was found having cracks in the insulating layer 4 after a durability test.

On the other hand, samples of No. 2 to 12 each provided with a film 21 of $SiO_2$ with thickness t from 0.05 to 2.0 $\mu$m were found each having a uniform glass layer without swelling and no crack formation was observed in any glass insulating layer 4 in the durability test.

Example 4

Here, investigation was carried out to find the correlation between the crystal peak of a film 21 of $SiO_2$ formed on the surface by heating silicon carbide in atmosphere by x-ray diffraction and the durability. The temperature of the heating in the atmosphere was controlled to be 1,000 to 1,800° C., the heating duration was changed in a range of 1 to 12 hours and further the cooling rate was adjusted to alter the quantities of crystal phases produced in the film 21.

Confirmation of the crystal phases of the film 21 was carried out using an x-ray diffraction apparatus of RINT 1400 V produced by Physical Science Electronic in conditions of 50 kV tube voltage and 200 mA tube current using a Cu tubular bulb, 0.020 degree of step width, 0.50 second of counting duration, and 2θ=20 to 80 degrees. The peaks of the (100) plane of cristobalite and the (102) plane of silicon carbide were measured and compared with each other by the heat height. Incidentally, to be simplified, the height was computed from the count of the intensity of each peak of the measurement data.

In such way, using samples made ready, the durability test similar to that of the example 3 was carried out to investigate the correlation between the crystal peak of a film 21 of $SiO_2$ by X-ray diffraction and the durability.

The results were shown in Table 4.

TABLE 4

| No. | Peak height of SiC (102) | Peak height of cristobalite (100) | Peak ratio (%) | Durability test |
|---|---|---|---|---|
| 1 | 32500 | 0 | 0 | ○ |
| 2 | 32300 | 350 | 1.1 | ○ |
| 3 | 32150 | 790 | 2.5 | ○ |
| 4 | 31800 | 1150 | 3.6 | ○ |
| 5 | 30900 | 2050 | 6.6 | ○ |
| 6 | 30450 | 2940 | 9.7 | ○ |
| 7 | 30210 | 3300 | 10.9 | cracks |
| 8 | 30010 | 3530 | 11.8 | cracks |

As being understood from Table 4, the samples of No. 7 and No. 8 with the peak height of the (101) plane of cristobalite exceeding 10% of the peak height of the (102) plane of silicon carbide were formed having cracks in the surface when the surface of the insulating layer 4 was observed after the durability test. On the other hand, samples of No. 1 to No. 6 with 10% or lower ratio were found having no cracks in the insulating layer 4 and showed excellent durability.

Example 5

The investigation was carried out for the relation between the flatness of a glass insulating layer 4 and the resistance value dispersion of heating element 5 formed on the insulating layer by printing method. Using silicon carbide substrates each coated with the glass insulating layer 4 and produced by a method similar to that of the example 3, a glass paste containing 30 wt. % of Au-Pt was printed on the insulating layer 4 and baked at 600° C. to form heating element 5. Regarding the flatness of the glass insulating layer 4, samples were made available which bear insulating layer 4 with respectively different flatness by adjusting the flatness of the respective silicon carbide substrates. The samples were made ready by forming heating element 5 which were previously formed in a transfer sheet and whose thickness was controlled on the surface of the glass insulating layer 4 with 350 μm in flatness for each sample and subjecting each sample to baking treatment.

The electric resistance of heating element 5 of each sample made ready by the above described manner was measured by dividing the heating element 5 into blocks of 5 cm and adjusting the resistance value to be same for every block and for every block, the dispersion was investigated.

The dispersion was calculated based on the following equation:

$$\text{dispersion}=(\text{the maximum resistance value}-\text{the minimum resistance value})/\text{the maximum resistance value} \times 100.$$

Samples with approximately same flatness were made ready three by three for respective flatness values and the average of the dispersion values of respective three samples was employed as the dispersion of the samples with each flatness value.

The results were shown in Table 5.

TABLE 5

| No. | Flatness of glass (μm) | Dispersion of resistance value (%) |
|---|---|---|
| 1 | <20 | 5 |
| 2 | 55 | 6 |
| 3 | 120 | 5 |
| 4 | 250 | 7 |
| 5 | 300 | 8 |
| 6 | 350 | 15 |

As shown in the Table 5, the samples of No. 6 with the glass insulating layers 4 with 350 μm flatness had resistance value dispersion as high as 15% and it was found that the resistance value distribution could not be adjusted unless trimming was carried out to far extent. On the other hand, the samples of No. 1 to No. 5 with flatness within 20 to 300 μm, showed 8% of lower resistance value dispersion and were found to be provided with controlled resistance value distribution by slight trimming.

Example 6

In this example, investigation was carried out for the relation between a softening point of glass contained in heating element 5 and the glass transition temperature of glass contained in an insulating layer 4 and for the correlation of the resistance value dispersion of the heating element 5 and the relation. The glass transition temperature and the softening point of glass were evaluated by using a powder obtained by grinding glass parts by a router by a differential scanning calorimeter. The evaluation method employed was carried out by confirming the endothermic peaks of the data, which are determined as a the transition temperature and a softening point, from the lower temperature side, and calculating the temperature difference. The parts of heating element 5 containing as little metal components as possible were measured for suppressing the effect of metals, while nitrogen gas was being blown to the parts.

Samples were made ready in a similar method to that of the example 5 while changing the combination of the types of glass. The resistance value dispersion was evaluated by the same manner as that of the example 5.

The results were shown in Table 6.

TABLE 6

| No. | Transition point of glass in insulating layer (° C.) | Softening point of glass in heating element (° C.) | Temperature difference (° C.) | Dispersion of resistance value (%) | Remark |
| --- | --- | --- | --- | --- | --- |
| 1 | 700 | 450 | 250 | 3 | |
| 2 | 700 | 550 | 150 | 5 | |
| 3 | 500 | 450 | 50 | 5 | |
| 4 | 500 | 500 | 0 | 8 | |
| 5 | 500 | 650 | −150 | 14 | |
| 6 | 450 | 650 | −200 | 18 | Bubbles in insulating layer |

As being understood from Table 6, each of Samples No. 1 to No. 4 with positive or zero difference of the transition temperature of glass contained in the insulating layer 4 from the transition temperature of glass contained in the heating element 5 showed a narrow resistance value dispersion, whereas Sample Nos. 5 and 6 with a negative difference showed a wide resistance value dispersion. Regarding Sample No. 6, parts where bubbling took place were formed in the structure of the insulating layer 4. According to the above described results, it was found effective to make the softening point of the glass contained in the heating element 5 higher than the transition temperature of the glass contained in the insulating layer 4 in order to improve the resistance distribution.

Example 7

In this example, investigation was carried out to find the relation between the infrared ray emissivity of silicon carbide substrate and the time taken to heat a wafer. Substrates made ready as silicon carbide substrates were the sample No. 1 produced using boron carbide and carbon as sintering aids, the sample No. 2 produced using $Al_2O_3$ and $Y_2O_3$ as sintering aids, and the sample No. 3 produced from a molded body of Si by carbonization by reactive sintering in methane gas flow. The respective samples were further subjected to formation of a film 21 of $SiO_2$ with 0.05 μm thickness thereon by the same method as that in the example 3 and to formation of an insulating layer 4 of glass with 200 μm thickness on the other major surface other than the face to be the wafer mounting surface 3 and further heating element 5 on the insulating layer 4 by a transfer printing method and finally subjected to baking to obtain heat-homogenizing plates 2.

Regarding the sample No. 3, a black SiC film was formed by CVD method on the mounting surface 3 of a wafer W to obtain the sample No. 4 and a cordierite film with 15 μm thickness by spraying was formed on the mounting surface 3 to obtain the sample No. 5. After that, the heating element 5 of the respective produced heat-homogenizing plates 2 were provided with resistance adjustment parts to improve the evenly heating property and then the resultant heat-homogenizing plates 2 were built in supporting bodies 11 as illustrated in FIG. 1 and kept at 200° C. After a wafer was mounted on each mounting surface 3, the time taken to stabilize the wafer temperature at 200° C. for each heat-homogenizing plate was compared with one another. The infrared ray emissivity was measured using Compact thermo TVS-2200 MK-II ST produced by Nippon Avionics Company Limited by measuring the emissivity at 200° C. before and after application of a black body to each mounting surface 3. The emissivity of each mounting surface before the black body application was calculated as the ratio to the emissivity after the black body application, which was set to be 100%.

The results were shown in Table 7.

TABLE 7

| No. | Silicon carbide | Coating | Infrared ray emissivity (%) | Heating time (second) |
| --- | --- | --- | --- | --- |
| 1 | Adding B, and C | non | 95 | 35 |
| 2 | Adding $Y_2O_3$, $Al_2O_3$, | non | 95 | 35 |
| 3 | Reactive sintering | non | 70 | 50 |
| 4 | Reactive sintering | CVD-SiC | 90 | 38 |
| 5 | Reactive sintering | Sprayed cordierite | 87 | 39 |

As shown in Table 7, Sample No. 3 with 80% of lower infrared ray emissivity took 50 seconds to increase the temperature and Sample Nos. 1, 2, 4, and 5 with 80% infrared ray emissivity took only 40 seconds or shorter to increase the temperature and were found desirable.

Example 8

A plurality of disk-like heat-homogenizing plates with 230 mm outer diameter with different thickness were made ready by grinding silicon carbide sintered bodies with 80 W/m.K thermal conductivity. A glass paste produced by kneading a glass powder with ethyl cellulose as a binder and terpineol as an organic solvent was applied to one major surfaces of the respective heat-homogenizing plates by a screen printing or transfer printing method to form insulating layers, heated to 150° C. to dry out the organic solvent and then to 550° C. for 30 minutes to carry out degreasing, and further baked at 700 to 900° C. to form insulating layers of glass with 200 μm thickness. Next, in order to form a heating element on the insulating layers, a glass paste containing a mixing powder of Au and Pd as conductive materials was transfer printed in a pattern as shown in FIG. 8 by a screen printing method, heated to 150° C. to dry out the organic solvent and then to 550° C. for 30 minutes to carry out degreasing, and further baked at 700 to 900° C. to form heating element with 50 μm thickness. After that, electric power supply parts were joined to the heating element by a conductive adhesive to produce wafer heating apparatuses.

Then, electric power was supplied to the electric power supply part of each wafer heating apparatus to make the heating element radiate heat to maintain the center of each mounting surface at 150° C. and the temperature distribution at that time was measured using a thermoviewer (JTG-5200 type produced by Nippon Electric Datum Company). After that, electric power supply was stopped to spontaneously cool each mounting surface and the time taken to cool the center of each mounting surface to 100° C. was measured.

Incidentally, to measure the temperature distribution in each mounting surface, the temperatures at six optional points on a pitch circle diameter (PCD) 200 mm on the mounting surface were measured and the difference between the maximum and the minimum of the temperatures was determined as the temperature dispersion.

To evaluate the results, those with temperature dispersion within 10° C. in the mounting surface and having cooling time within 4 minutes were determined to be satisfactory.

The results of respective heat-homogenizing plates were as shown in Table 8.

TABLE 8

| The plate thickness (mm) | Temperature distribution (° C.) | 150→100° C. cooling time (second) | Judgment |
|---|---|---|---|
| 1.0 | 15 | 25 | x |
| 1.5 | 10 | 45 | Δ |
| 2.0 | 7 | 50 | ○ |
| 2.5 | 5 | 65 | ○ |
| 3.0 | 3 | 80 | ○ |
| 5.0 | 2 | 130 | ○ |
| 7.0 | 1 | 180 | ○ |
| 8.0 | 0.5 | 210 | Δ |
| 9.0 | 0.5 | 240 | x |

According to the results, it was found that as the thickness of a heat-homogenizing plate increased more, the temperature distribution of a mounting surface became narrower and contrary, the cooling time became longer. That is, the temperature dispersion of a mounting surface and the cooling time were found contrary to each other. By controlling the thickness of a heat-homogenizing plate to be 2 to 7 mm, the temperature dispersion of the mounting surface could be kept within 10° C. and the cooling time could be within 4 minutes.

Consequently, it was found preferable to control the thickness of a heat-homogenizing plate to be 2 to 7 mm and further preferable to be 2.5 to 4 mm.

Example 9

Wafer heating apparatuses were produced on an experimental basis in the same conditions as those of the example 8 except that the thickness of each heat-homogenizing plate was controlled to be 4 mm and the thickness of each insulating layer was made different and glass with different thermal expansion coefficients was employed for the insulating layer and experiments were carried out to investigate the withstand voltage of the insulating layers.

Incidentally, in each wafer heating apparatus, the temperature distribution of each mounting surface was measured by a thermoviewer after manufacture on an experimental basis and a conductive sheet of Au was struck to the heating element at the points where the temperature was found high and thus trimming adjustment was carried out as to keep the temperature dispersion of each mounting surface within 1° C.

The withstand voltage was evaluated by measuring the leakage current quantity of each insulating layer by a withstand voltage meter (under trade name of TOS 5051 produced by Kikusui Electronic Industry Co.) while the voltage value to be applied to the electric power supply parts was successively increased from 0.5 kV for every 10 seconds and at the time when the leakage current quantity exceeds 20 mA, it was judged that the dielectric breakdown took place and the voltage at that time was regarded as the withstand voltage. Those with withstand voltage 1.5 kV or higher were determined to be satisfactory.

The respective results were as shown in Table 9.

TABLE 9

| Thermal expansion coefficient ($\times 10^{-7}$/° C.) | Thickness of the insulating layer (μm) | Withstand voltage level (kV) | Judgment |
|---|---|---|---|
| 29 | 100 | — | x |
| 32 | 80 | 1.0 | x |
|  | 100 | 1.5 | ○ |
|  | 200 | 3.0 | ○ |
|  | 300 | 4.5 | ○ |
|  | 400 | >5.0 | ○ |
|  | 500 | >5.0 | ○ |
|  | 600 | >5.0 | ○ |
|  | 650 | — | x |
| 37 | 80 | 1 | x |
|  | 100 | 1.5 | ○ |
|  | 200 | 3 | ○ |
|  | 300 | 4.5 | ○ |
|  | 400 | >5.0 | ○ |
|  | 500 | >5.0 | ○ |
|  | 600 | >5.0 | ○ |
|  | 700 | >5.0 | ○ |
|  | 750 | — | x |
| 44 | 80 | 1 | x |
|  | 100 | 1.5 | ○ |
|  | 200 | 3 | ○ |
|  | 300 | 4.5 | ○ |
|  | 400 | >5.0 | ○ |
|  | 500 | >5.0 | ○ |
|  | 600 | >5.0 | ○ |
|  | 650 | — | x |
| 47 | 100 | — | x |

\* - shows an insulating layer where cracking took place.

As a result, even if an insulating layer contained glass whose thermal expansion coefficient was within a range of $32 \times 10^{-7}$/° C. to $44 \times 10^{-7}$/° C. in a temperature range of 0° C. to 200° C., the insulating layer having thinner than 200 μm thickness could not have satisfactory withstand voltage, 1.5 kV or higher, and contrary, with thickness exceeding 600 μm, cracks took place in the insulating layer at the time of cooling during the manufacturing process.

Whereas, by controlling the thermal expansion coefficient to be within a range of $32 \times 10^{-7}$/° C. to $44 \times 10^{-7}$/° C. in a temperature range of 0 to 200° C. and the thickness of the insulating layer to be 100 μm to 350 μm, cracks could be prevented and withstand voltage of 1.5 kV or higher could be obtained and sufficiently excellent insulating property could be assured.

Consequently, it was found better to use glass with the thermal expansion coefficient within a range of $32 \times 10^{-7}$/° C. to $44 \times 10^{-7}$/° C. in a temperature range of 0 to 200° C., in the case of forming an insulating layer of glass, and to control the thickness of the insulating layer to be 100 μm to 350 μm.

Next, a plurality of disk-like heat-homogenizing plates with 230 mm outer diameter and 4 mm thickness were produced by grinding silicon carbide sintered bodies with 80 W/m.K thermal conductivity. A polyimide varnish (U varnish S produced by Ube Industries Ltd.) was applied by a spin coater to one major surface of each heat-homogenizing plate to form an insulating layer thereon while the thickness being changed and then dried at 70° C. and baked at 400 to 450° C. to form insulating layers of the polyimide resin. Next, in order to form heating element on each insulating layer, a PbO-based glass paste containing a Au powder and a Pd powder as conductive materials was printed in a pattern as shown in FIG. 8 by a screen printing method and then baked at 400 to 450° C. to form heating element with 50 μm thickness. After that, electric power supply parts were joined to the heating element by a conductive adhesive to produce wafer heating apparatuses.

In order to observe the withstand voltage of each insulating layer made of the polyimide resin and the presence or the absence of blisters in the layer, the following measurement was carried out: for the measurement of the withstand voltage, the leakage current quantity of each insulating layer was measured by a withstand voltage meter (under trade name of TOS 5051 produced by Kikusui Electronic Industry Company) while the voltage value to be applied to the electric power supply parts was successively increased from 0.5 kV for every 10 seconds and at the time when the leakage current quantity exceeds 20 mA, it was judged that the dielectric breakdown took place and the voltage at that time was regarded as the withstand voltage. For the observation of blisters, existence of blisters between each heat-homogenizing plate and its insulating layer was observed with eye observation.

Those with withstand voltage 1.5 kV or higher and free of blisters were determined to be satisfactory.

The respective results are shown in Table 10.

TABLE 10

| Thickness of the insulating layer (μm) | Withstand voltage level (kV) | Blisters | Judgment |
| --- | --- | --- | --- |
| 20 | 1.0 | Absence | x |
| 30 | 1.5 | Absence | o |
| 60 | 3.0 | Absence | o |
| 100 | >5.0 | Absence | o |
| 150 | >5.0 | Absence | o |
| 170 | >5.0 | Presence | x |
| 200 | >5.0 | Presence | x |

According the results, in the case where an insulating layer was produced from a polyimide resin, by controlling the thickness to be within 30 to 150 μm, no blister took place and the withstand voltage of 1.5 kV or higher could be obtained to assure sufficiently excellent insulating property.

What we claim is:

1. A wafer heating apparatus comprising:
   a heat-homogenizing plate comprising a ceramic substrate and having a mounting surface which is an upper surface of the ceramic substrate for mounting a wafer thereon,
   a heating element provided on a lower surface of the heat-homogenizing plate; and
   pad electrodes connecting electrically to the heating element on said lower surface,
   wherein the mounting surface is convex,
   wherein a plurality of supporting pins are plated on the mounting surface to support a lower surface of the wafer thereon spaced from the mounting surface with the distance of the center portion of the mounting surface to the wafer being smaller than that of the peripheral portion thereof to the wafer.

2. The wafer heating apparatus according to claim 1, wherein a height of the central portion of the mounting surface to a peripheral edge of the mounting surface is in a range of 10 to 80 μm.

3. The wafer heating apparatus according to claim 1, wherein the ceramic substrate includes, as a major component, silicon carbide, aluminum nitride, boron carbide or boron nitride.

4. A wafer heating apparatus comprising:
   a heat-homogenizing plate comprising a ceramic substrate and having a mounting surface which is an upper surface of the ceramic substrate for mounting a wafer thereon,
   a heating element provided on a lower surface of the heat-homogenizing plate; and
   pad electrodes connecting electrically to the heating element on said lower surface,
   wherein the mounting surface is convex, and
   wherein an insulating layer is secured on the ceramic substrate and the heating element is secured on said insulating layer, the insulating layer being a glass layer having an lower thermal expansion coefficient by $0.2 \times 10^{-6}$/K to $0.7 \times 10^{-6}$/K then the ceramic substrate.

5. A wafer heating apparatus comprising:
   a heat-homogenizing plate comprising a ceramic substrate and having a mounting surface which is an upper surface of the ceramic substrate for mounting a wafer thereon,
   a heating element provided on a lower surface of the heat-homogenizing plate; and
   pad electrodes connecting electrically to the heating element on said lower surface,
   wherein the mounting surface is convex, and
   wherein the ceramic substrate is formed of silicon carbide or boron carbide as a main component, which substrate is 1.5 to 8 mm in thickness, and an insulating layer applied on the ceramic substrate, the heating element being applied on the insulating layer and insulated electrically from the ceramic substrate, and pad electrodes connecting electrically to the heating element which is provided on the insulating layer.

6. The wafer heating apparatus according to claim 5, wherein the insulating layer is a glass layer having a thermal expansion coefficient of $3.2$–$4.4 \times 10^{-6}$/K and having a thickness of 100–350 μm.

7. The wafer heating apparatus according to claim 5, wherein the insulating layer comprises a polyimide resin having a thickness of 30–150 μm.

8. A wafer heating apparatus comprising:
   a heat-homogenizing plate comprising a ceramic substrate and having a mounting surface which is an upper surface of the ceramic substrate for mounting a wafer thereon,
   a heating element provided on a lower surface of the heat-homogenizing plate; and
   pad electrodes connecting electrically to the heating element on said lower surface,
   wherein the mounting surface is convex, and
   wherein the ceramic substrate is formed of silicon carbide, a silicon oxide layer of a thickness of 0.05 to 2 μm is formed on the lower surface of heat-homogenizing plate, a glass insulating layer of a thickness of 10 to 600 μm is formed on the silicon oxide layer of the ceramic substrate, and the heating element and pad electrodes connecting the heating element are formed on said insulating layer.

9. The wafer heating apparatus according to claim 8, wherein the silicon oxide layer has cristobalite phase at a diffraction peak intensity of a (101) plane of 10% or less of that of a (102) plane of silicon carbide phase as measured by X-ray diffraction.

10. The wafer heating apparatus according to claim 8, wherein the glass insulating layer has 300 μm or less of a surface flatness.

11. The wafer heating apparatus according to claim 8, the heating element is formed of at least one metal or an alloy containing of metals selected from a group consisting of Au, Ru, Rh, Pd, Re, Os, Ir and Pt.

12. The ceramic heater according to claim 8, the heating element contains a glass component and a softening temperature is lower than transference temperature of the glass insulating layer.

13. A wafer heating apparatus comprising:

a heat-homogenizing plate comprising a ceramic substrate and having a mounting surface which is an upper surface of the ceramic substrate for mounting a wafer thereon, a heating element provided on a lower surface of the heat-homogenizing plate, pad electrodes connecting electrically to the heating element on said lower surface, wherein the mounting surface is convex, and a support body of supporting the periphery of the heat-homogenizing plate, and elastic members disposed on the mounting side of the support body for forcing the heat-homogenizing plate to the supporting body by the elastically force of the elastic members.

14. A wafer heating apparatus comprising:

a heat-homogenizing plate comprising a ceramic substrate and having a mounting surface which is an upper surface of the ceramic substrate for mounting a wafer thereon, a heating element provided on a lower surface of the heat-homogenizing plate, pad electrodes connecting electrically to the heating element on said lower surface, wherein the mounting surface is convex, and one or more bar-shaped terminals to electrically connect to the respective pad electrodes by elastic members disposed on a rear side of the support body for forcing the end portions of said terminals onto the pad electrodes by the elastic force of said elastic members.

15. A wafer heating apparatus comprising:

a heat-homogenizing plate comprising a ceramic substrate and having a mounting surface which is an upper surface of the ceramic substrate for mounting a wafer thereon, a heating element provided on a lower surface of the heat-homogenizing plate, pad electrodes connecting electrically to the heating element on said lower surface, wherein the mounting surface is convex, and at least one thermocouple whose end portion is being pressed and thermally connects to the heat-homogenizing plate by a elastically pressing force to measure the heat-homogenizing plate temperature.

* * * * *